US006871334B2

(12) United States Patent
Mabuchi et al.

(10) Patent No.: US 6,871,334 B2
(45) Date of Patent: Mar. 22, 2005

(54) METHOD OF DEDUCING EQUIVALENT CIRCUIT AND SYSTEM FOR THE SAME

(75) Inventors: Yuichi Mabuchi, Hitachi (JP); Hideshi Fukumoto, Hitachinaka (JP)

(73) Assignee: Hitachi, Ltd. (JP)

( * ) Notice: Subject to any disclaimer, the term of this patent is extended or adjusted under 35 U.S.C. 154(b) by 0 days.

(21) Appl. No.: 10/270,498

(22) Filed: Oct. 16, 2002

(65) Prior Publication Data

US 2003/0109995 A1 Jun. 12, 2003

(30) Foreign Application Priority Data

Nov. 20, 2001 (JP) ........................................ 2001-355219

(51) Int. Cl.[7] .............................................. G06F 17/50
(52) U.S. Cl. ........................ 716/5; 716/1; 716/2; 716/3
(58) Field of Search .......................... 716/5, 1–4, 6–21, 716/15; 703/2, 14; 702/64

(56) References Cited

U.S. PATENT DOCUMENTS

| | | | |
|---|---|---|---|
| 5,625,578 A | * | 4/1997 | Du Cloux et al. ............... 703/2 |
| 5,692,158 A | * | 11/1997 | Degeneff et al. ............... 703/2 |
| 6,453,275 B1 | * | 9/2002 | Schoenmaker et al. ........ 703/2 |
| 6,472,886 B2 | * | 10/2002 | Lee ............................. 324/659 |
| 6,557,154 B1 | * | 4/2003 | Harada et al. ................ 716/11 |
| 6,601,025 B1 | * | 7/2003 | Moore et al. ................. 703/14 |
| 6,662,149 B1 | * | 12/2003 | Devgan et al. ............... 703/14 |

\* cited by examiner

*Primary Examiner*—Vuthe Siek
*Assistant Examiner*—Magid Y. Dimyan
(74) *Attorney, Agent, or Firm*—Dickstein Shapiro Morin & Oshinsky LLP

(57) ABSTRACT

The invention provides a method of calculating an equivalent circuit, which reduces the number of elements constituting a network to a large extent with a target accuracy secured. The method of the invention calculates an equivalent circuit by a computer, with regard to an object that has a conductor, a dielectric to support the conductor, and plural input/output terminals to the outside. Step 1 in the method receives inputs of geometry information to specify a shape of a conductor in a circuit board being the object of determining the equivalent circuit, and material information to specify a material of the circuit board; Step 2 partitions the shape of the objective conductor into meshes on the basis of the geometry information received, and creates mesh data to be expressed; Step 3 calculates a nodal admittance matrix from the mesh data, and stores the result; step 4 calculates the number of nodes and the number of independent networks on the basis of the mesh data, determines an incidence matrix, and determines the structure of an equivalent network by means of the calculated nodal admittance matrix and incidence matrix; and Step 5 determines the values of elements of the equivalent network.

5 Claims, 25 Drawing Sheets

```
.subckt LR-Model
+ node_1    node_2    node_3    node_4      ⎫ Dt1
+ node_5    node_6                          ⎭
*CURRENT-REFERENCE VOLTAGE SOURCE           ⎫
V%node1    node_1    %node_1    DC 0 AC 0   ⎪
V%node2    node_2    %node_2    DC 0 AC 0   ⎪
V%node3    node_3    %node_3    DC 0 AC 0   ⎬ Dt2
V%node4    node_4    %node_4    DC 0 AC 0   ⎪
V%node5    node_5    %node_5    DC 0 AC 0   ⎪
V%node6    node_6    %node_6    DC 0 AC 0   ⎭
*RESISTANCE AND INDUCTANCE OF BRANCH        ⎫
Ldev 00001    %nd 0001    lr 00001    2.02569E-08
Rdev 00001    lr 00001    %nd 0002    5.63728E-02
Ldev 00002    %nd 0001    lr 00002    2.03070E-08
Rdev 00002    lr 00002    %nd 0003    3.20958E-02
Ldev 00003    %nd 0001    lr 00003    2.25940E-08  ⎬ Dt3
Rdev 00003    lr 00003    %nd 0004    6.64661E-02     [R:4569]
                ⋮                                    [L:4569]
Ldev 00004    %nd 1605    lr 04569    1.92423E-08
Rdev 00004    lr 04569    %nd 1604    5.41084E-02 ⎭
*MUTUAL-INDUCTANCE                          ⎫
Kdev 0000001    Ldev 00001    Ldev 00002    2.48429E-01
Kdev 0000002    Ldev 00001    Ldev 00003    1.68134E-01
Kdev 0000003    Ldev 00001    Ldev 00004    1.53056E-01  ⎬ Dt4
                ⋮                                        (M:2087561)
Kdev 2087561    Ldev 04568    Ldev 04569    6.36513E-01 ⎭
.ends
```

$$\begin{bmatrix} & T1 & T2 & T3 & T4 & T5 & T6 & T7 & T8 \\ T1 & 1.01\times 10^{3} & -3.80\times 10^{2} & -2.42\times 10^{2} & -3.84\times 10^{2} & -7.59\times 10^{-12} & 3.22\times 10^{-11} & -2.15\times 10^{-11} & -5.87\times 10^{-12} \\ T2 & -3.80\times 10^{2} & 1.35\times 10^{3} & -6.17\times 10^{2} & -3.48\times 10^{2} & 7.15\times 10^{-12} & -3.98\times 10^{-11} & 2.41\times 10^{-11} & 8.11\times 10^{-12} \\ T3 & -2.42\times 10^{2} & -6.17\times 10^{2} & 1.20\times 10^{3} & -3.41\times 10^{2} & -5.01\times 10^{-12} & 6.41\times 10^{-12} & -5.93\times 10^{-11} & 5.99\times 10^{-12} \\ T4 & -3.84\times 10^{2} & -3.48\times 10^{2} & -3.41\times 10^{2} & 1.07\times 10^{3} & 8.66\times 10^{-12} & 2.53\times 10^{-12} & 4.64\times 10^{-11} & -5.66\times 10^{-11} \\ T5 & -7.59\times 10^{-12} & 7.15\times 10^{-12} & -5.01\times 10^{-12} & 8.66\times 10^{-12} & 2.12\times 10^{2} & -2.87\times 10^{2} & -4.80\times 10^{2} & -1.35\times 10^{2} \\ T6 & 3.22\times 10^{-11} & -3.98\times 10^{-11} & 6.41\times 10^{-12} & 2.53\times 10^{-12} & -2.87\times 10^{1} & 3.66\times 10^{2} & -2.30\times 10^{2} & -1.70\times 10^{2} \\ T7 & -2.15\times 10^{-11} & 2.41\times 10^{-11} & -5.93\times 10^{-11} & 4.64\times 10^{-11} & -4.80\times 10^{1} & -2.30\times 10^{2} & 4.57\times 10^{2} & -1.79\times 10^{2} \\ T8 & -5.87\times 10^{-12} & 8.11\times 10^{-12} & 5.99\times 10^{-12} & -5.66\times 10^{-11} & -1.35\times 10^{2} & -1.70\times 10^{2} & -1.79\times 10^{2} & 4.21\times 10^{2} \end{bmatrix} \begin{bmatrix} V_1 \\ V_2 \\ V_3 \\ V_4 \\ V_5 \\ V_6 \\ V_7 \\ V_8 \end{bmatrix} = \begin{bmatrix} I_1 \\ I_2 \\ I_3 \\ I_4 \\ I_5 \\ I_6 \\ I_7 \\ I_8 \end{bmatrix} \quad \cdots(51)$$

FIG.11

$$\begin{bmatrix} & T1 & T2 & T3 & T4 & T5 & T6 & T7 & T8 \\ T1 & 1.51\times10^8 & -4.92\times10^7 & -1.03\times10^7 & -9.15\times10^7 & -1.04\times10^8 & 9.81\times10^6 & 2.69\times10^7 & 6.77\times10^7 \\ T2 & -4.92\times10^7 & 3.08\times10^8 & -2.07\times10^8 & -5.19\times10^7 & 1.13\times10^7 & -1.83\times10^8 & 1.18\times10^8 & 5.30\times10^7 \\ T3 & -1.03\times10^7 & -2.07\times10^8 & 3.25\times10^8 & -1.08\times10^8 & 2.42\times10^7 & 1.21\times10^8 & -2.31\times10^8 & 8.52\times10^7 \\ T4 & -9.15\times10^7 & -5.19\times10^7 & -1.08\times10^8 & 2.51\times10^8 & 6.89\times10^7 & 5.14\times10^7 & 8.55\times10^7 & -2.06\times10^8 \\ T5 & -1.04\times10^8 & 1.13\times10^7 & 2.42\times10^7 & 6.89\times10^7 & 1.09\times10^8 & -1.36\times10^7 & -2.31\times10^7 & -7.28\times10^7 \\ T6 & 9.81\times10^6 & -1.83\times10^8 & 1.21\times10^8 & 5.14\times10^7 & -1.36\times10^7 & 2.01\times10^8 & -1.36\times10^8 & -5.14\times10^7 \\ T7 & 2.69\times10^7 & 1.18\times10^8 & -2.31\times10^8 & 8.55\times10^7 & -2.31\times10^7 & -1.36\times10^8 & 2.51\times10^8 & -9.18\times10^7 \\ T8 & 6.77\times10^7 & 5.30\times10^7 & 8.52\times10^7 & -2.06\times10^8 & -7.28\times10^7 & -5.14\times10^7 & -9.18\times10^7 & 2.16\times10^8 \end{bmatrix} \begin{bmatrix} V_1 \\ V_2 \\ V_3 \\ V_4 \\ V_5 \\ V_6 \\ V_7 \\ V_8 \end{bmatrix} = \begin{bmatrix} \dot{I}_1 \\ \dot{I}_2 \\ \dot{I}_3 \\ \dot{I}_4 \\ \dot{I}_5 \\ \dot{I}_6 \\ \dot{I}_7 \\ \dot{I}_8 \end{bmatrix} \quad \cdots(52)$$

FIG.13A $$\begin{pmatrix} 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ -1 & 0 & 0 & 0 & 0 & 1 & 0 & 0 \\ -1 & 0 & 0 & 0 & 0 & 0 & 1 & 0 \\ -1 & 0 & 0 & 0 & 0 & 0 & 0 & 1 \end{pmatrix} \begin{pmatrix} V_1 \\ V_2 \\ V_3 \\ V_4 \\ V_5 \\ V_6 \\ V_7 \\ V_8 \end{pmatrix} = \begin{pmatrix} 1 & 1 & 1 & 1 & 0 & 0 & 0 & 0 \\ 0 & 1.34\times10^{-3} & 8.92\times10^{-2} & 7.17\times10^{-4} & 0 & 0 & 0 & 0 \\ 0 & 8.92\times10^{-2} & 1.51\times10^{-3} & 7.69\times10^{-4} & 0 & 0 & 0 & 0 \\ 0 & 7.17\times10^{-4} & 7.69\times10^{-4} & 1.41\times10^{-3} & 0 & 0 & 0 & 0 \\ 0 & 0 & 0 & 0 & 1 & 1 & 1 & 1 \\ 0 & 0 & 0 & 0 & 0 & 7.18\times10^{-3} & 5.20\times10^{-3} & 4.04\times10^{-3} \\ 0 & 0 & 0 & 0 & 0 & 5.20\times10^{-3} & 6.38\times10^{-3} & 4.04\times10^{-3} \\ 0 & 0 & 0 & 0 & 0 & 4.04\times10^{-3} & 4.04\times10^{-3} & 5.12\times10^{-3} \end{pmatrix} \begin{pmatrix} I_1 \\ I_2 \\ I_3 \\ I_4 \\ I_5 \\ I_6 \\ I_7 \\ I_8 \end{pmatrix}$$

...(53)

FIG.13B $$\begin{bmatrix} V_2-V_1 \\ V_3-V_1 \\ V_4-V_1 \\ V_6-V_5 \\ V_7-V_5 \\ V_8-V_5 \end{bmatrix} = \begin{bmatrix} 1.34\times10^{-3} & 8.92\times10^{-2} & 7.17\times10^{-4} & 0 & 0 & 0 \\ 8.92\times10^{-2} & 1.51\times10^{-3} & 7.69\times10^{-4} & 0 & 0 & 0 \\ 7.17\times10^{-4} & 7.69\times10^{-4} & 1.41\times10^{-3} & 0 & 0 & 0 \\ 0 & 0 & 0 & 7.18\times10^{-3} & 5.20\times10^{-3} & 4.04\times10^{-3} \\ 0 & 0 & 0 & 5.20\times10^{-3} & 6.38\times10^{-3} & 4.04\times10^{-3} \\ 0 & 0 & 0 & 4.04\times10^{-3} & 4.04\times10^{-3} & 5.12\times10^{-3} \end{bmatrix} \begin{bmatrix} I_2 \\ I_3 \\ I_4 \\ I_6 \\ I_7 \\ I_8 \end{bmatrix}$$

...(54)

FIG.13C $I_1+I_2+I_3+I_4=0, \quad I_5+I_6+I_7+I_8=0$ ...(55)

FIG.14

$$\begin{bmatrix} V_2-V_1 \\ V_3-V_1 \\ V_4-V_1 \\ V_6-V_5 \\ V_7-V_5 \\ V_8-V_5 \end{bmatrix} = \begin{bmatrix} 2.66\times10^{-8} & 2.74\times10^{-8} & 1.38\times10^{-8} & 2.54\times10^{-8} & 2.66\times10^{-8} & 1.31\times10^{-8} \\ 2.74\times10^{-8} & 3.85\times10^{-8} & 1.95\times10^{-8} & 2.66\times10^{-8} & 3.71\times10^{-8} & 1.87\times10^{-8} \\ 1.38\times10^{-8} & 1.95\times10^{-8} & 2.80\times10^{-8} & 1.31\times10^{-8} & 1.87\times10^{-8} & 2.67\times10^{-8} \\ 2.54\times10^{-8} & 2.66\times10^{-8} & 1.31\times10^{-8} & 3.83\times10^{-8} & 3.62\times10^{-8} & 2.03\times10^{-8} \\ 2.66\times10^{-8} & 3.71\times10^{-8} & 1.87\times10^{-8} & 3.62\times10^{-8} & 4.83\times10^{-8} & 2.59\times10^{-8} \\ 1.31\times10^{-8} & 1.87\times10^{-8} & 2.67\times10^{-8} & 2.03\times10^{-8} & 2.59\times10^{-8} & 3.53\times10^{-8} \end{bmatrix} \begin{bmatrix} i_2 \\ i_3 \\ i_4 \\ i_6 \\ i_7 \\ i_8 \end{bmatrix} \quad \cdots(56)$$

FIG.16

```
.subckt LR-Model                                          ⎫
+ node_1   node_2    node_3    node_4   node_5    ⎬ Dt6
+ node_6   node_7    node_7                       ⎭
*CURRENT-REFERENCE VOLTAGE SOURCE                 ⎫
V%node_2   node_2   %node_2   DC 0 AC 0           ⎬ Dt7
V%node_3   node_3   %node_3   DC 0 AC 0           ⎭
              ⋮

*RESISTANCE AND INDUCTANCE OF BRANCH              ⎫
Ldev 00001   %node_2   lr 00011   2.66050E-08     ⎪
Rdev 00001   lr 00011  rr 00011   1.33818E-03     ⎬ Dt8
Ldev 00002   %node_3   lr 00012   3.84736E-08     ⎪
Rdev 00002   lr 00012  rr 00012   1.50960E-03     ⎭
              ⋮

*MUTUAL-INDUCTANCE                                ⎫
Kdev 000001   Ldev 00001   Ldev 00002   8.57892E-01 ⎪
Kdev 000002   Ldev 00001   Ldev 00003   5.04991E-01 ⎬ Dt9
Kdev 000003   Ldev 00001   Ldev 00004   7.95649E-01 ⎭
              ⋮

*MUTUAL-RESISTANCE                                ⎫
Hdev 100012   rr 00011   rr 10011   V%node_3   6.27360E-01 ⎪
Hdev 100013   rr 10011   %node_1   V%node_4   5.22398E-01 ⎬ Dt10
Hdev 200011   rr 00012   rr 10012   V%node_2   6.27360E-01 ⎪
              ⋮                                             ⎭
.ends
```

(LINEAR SCALE)

FIG.23

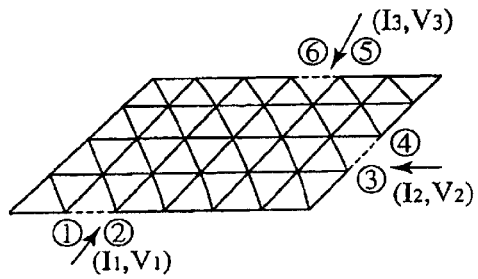

FIG.24

| | NODE EXPRESSION | BRANCH EXPRESSION |
|---|---|---|
| EQUIVALENT CIRCUIT | $I_1 \to \text{①} V_1$, $I_2 \to \text{②} V_2$ → NODAL ADMITTANCE MATRIX (Y) → $\text{③} V_3 \leftarrow I_3$, $\text{④} V_4 \leftarrow I_4$ <br> DEFINE CURRENT AND VOLTAGE TO EACH NODE | ① $(v_1,i_1)$ ③, ② $(v_3,i_3)$ → BRANCH ADMITTANCE MATRIX (D) → $(v_2,i_2)$ ④ <br> DEFINE CURRENT AND VOLTAGE AS RELATIVE VALUE BETWEEN NODES |
| DETERMINANT | $I = YV$ <br> $I = \begin{pmatrix} I_1 \\ I_2 \\ I_3 \\ I_4 \end{pmatrix} V = \begin{pmatrix} V_1 \\ V_2 \\ V_3 \\ V_4 \end{pmatrix}$ <br> I:NODAL CURRENT, V:NODAL VOLTAGE, Y:NODAL ADMITTANCE MATRIX | $i = Dv$ <br> $i = \begin{pmatrix} i_1 \\ i_2 \\ i_3 \end{pmatrix} v = \begin{pmatrix} v_1 \\ v_2 \\ v_3 \end{pmatrix}$ <br> i=BRANCH CURRENT, v=BRANCH VOLTAGE, D=BRANCH ADMITTANCE MATRIX (FOR TEMPORAL DISTINCTION) |
| RELATION BETWEEN NODE AND BRANCH | RELATION BETWEEN VOLTAGE AND CURRENT <br> $I = Ai$ <br> $v = A^t V$ <br> (A:INCIDENCE MATRIX) | RELATION OF ADMITTANCE MATRIX <br> $Y = ADA^t$ <br> CALCULATING INCIDENCE MATRIX A WILL DETERMINE BRANCH ADMITTANCE MATRIX |

METHOD OF DEDUCING EQUIVALENT CIRCUIT AND SYSTEM FOR THE SAME

BACKGROUND OF THE INVENTION

This invention relates to a technique that represents a network with an equivalent circuit, and more particularly to a technique that represents an equivalent circuit with few components with an accuracy secured.

Accompanied with the tendency to a higher speed in the LSI operational frequency, there emerges a problem of (EMI) Electro Magnetic Interference, that electronic equipment incorporating such a high speed LSI gives radiation and conduction noises to the other electronic equipment. Efforts to solve this EMI problem have been made for a measure that suppresses radiation noises and/or reduces conduction noises, individually to prototypes and products by means of a trial-and-error method. However, such a symptomatic measure invites an increase of product development cost and an extension of development term, which leads to lowering a competitive power against products of other companies. Thus, there arises a necessity of a design system, whereby suppressing the radiation noises and reducing the conduction noises can be taken into consideration at the design stage of a product.

The radiation and conduction noises are created due to high frequency currents generated by high-speed switching operations of an LSI. As shown in FIG. 3A, high frequency currents generated inside an LSI 110 propagate into a power supply/GND layer 120 of a PCB 100 and a power supply cable 130, which produces conduction noises CN. And, the high frequency currents radiate electromagnetic waves through a resonance of the power supply/GND layer 120 by the conduction noises CN and an antenna function of the power supply cable 130 itself. The electromagnetic waves present radiation noises RN. Therefore, to design electronic equipment in consideration for suppressing the conduction noises and radiation noises, there arises a necessity of a predictive technique for evaluating with high accuracy the high frequency currents that propagate into the PCB during the operation of an LSI.

Generally, the predictive evaluation of the high frequency currents that propagate into the PCB during the operation of an LSI employs a method by a circuit analysis. This method reproduces the electric characteristics (current and voltage waveforms, etc.) of electronic equipment in the operational state of an LSI by means of a computer simulation, and specifies a location that will give a problem of EMI. This inevitably requires a modeling technique for a PCB equivalent circuit, which reproduces the electric characteristics in the operational state of an LSI with high accuracy.

Now, an equivalent circuit creating technique by the inductance (L) and resistance (R) will be explained with an example of the PEEC "Partial Element Equivalent Circuit" method that is the equivalent circuit creating method. FIG. 2 illustrates a workflow for creating an equivalent circuit by the PEEC method. According to this workflow, a PCB equivalent circuit is created. The equivalent circuit is created by means of a computer.

Step S101 receives an input to the computer regarding the geometry and material information of a PCB conductor. Here, the PCB includes insulating layers such as a glass epoxide. The input here receives only the shape information of the conductor.

FIG. 3B illustrates a geometry of only the conductor of the PCB that received the input. The PCB in FIG. 3B has a size of 100 mm×100 mm, conductor thickness of 35?m, material of Cu, and double layer structure with the interlayer 1 mm. A first layer 120a and a second layer 120b have individually four, totally eight circuit connection terminals T1 through T8.

Step S102 creates mesh data from the conductor geometry data. FIG. 4 illustrates the mesh data created from the PCB conductor geometry data in FIG. 3B. If the influence of the skin effect is disregarded, the currents will flow uniformly in the thickness direction of the conductor. Accordingly FIG. 4 illustrates a state that the PCB conductor is approximated into two-dimensional planes 220a and 220b, by ignoring the thickness thereof, and the mesh data are created by means of triangular elements 221.

Step S103 defines a network of an equivalent circuit, and calculates resistors (R) and inductances (L) of each branches, and mutual inductances (M) between inductors. The PEEC method sets a node (N) at the center of a triangular mesh, and defines a network so as to connect the node and the nodes at the centers of the three triangular meshes adjoining to the node. Each branch of the network includes a series connection of R and L, and a mutual inductance (M) between the inductances (L). FIG. 5 illustrates this network. Table 1 illustrates the number of nodes and the number of branches in the mesh data in FIG. 4. The step calculates the resistance (R), inductance (L), and mutual inductance (M) between inductors each, with regard to each of the branches in the network. The calculation of R, L, M is disclosed in detail in the 'Practical Simulation of PRINTED CIRCUIT BOARD and related structures' written by K. J. Scott, published by RESERCH STUDIES PRESS LTD., England.

TABLE 1

Number of Nodes and Branches in the Mesh Data in FIG. 4

| Number of Nodes | 1605 |
|---|---|
| Number of Branches | 4569 |

Step S104 synthesizes R, L, and M between inductors each that are calculated to each branches in the network into a network. FIG. 6 illustrates a network composed of R, L, M, being calculated to the PCB in FIG. 3 and FIG. 4. FIG. 6 illustrates a state that the branches are reduced from the total network in order to grasp it easily. As shown in FIG. 6, the network includes plural intermediate nodes N other than the circuit connection terminals T1 though T8, and forms a matrix-type connection with the branches SC having R and L connected in series, which is a model that reproduces the shape of the PCB conductor. Table 2 illustrates the number of R, L, M that constitute the equivalent circuit to the PCB in FIG. 3B.

TABLE 2

Number of R, L, M Constituting the PCB Equivalent Circuit in FIG. 3 and FIG. 4

| R | 4569 |
|---|---|
| L | 4569 |
| M | 20875761 |

Step S105 outputs the equivalent circuit, in accordance with the data format of the circuit analysis software. FIG. 7 illustrates a part of data when the equivalent circuit to the PCB in FIG. 3B is outputted in accordance with the data format of the universal circuit analysis software SPICE.

FIG. 7 illustrates four kinds of data Dt1 through Dt4. The data Dt1 represents the names of the circuit connection terminals, and the last numbers indicate the PCB terminal numbers as shown in FIG. 3B. FIG. 7 shows an example that includes 6 terminals. Dt2 represents the data of voltage sources for the current reference. Dt3 represents the data of the resistances R and inductances L to each of the branches in the network. This case includes the data number of R: 4569 and the data number of L: 4569. Dt4 represents the data of the mutual inductances M between the inductances L in the network. This case includes the data number of M: 2087561.

The predictive evaluation of the high frequency currents that propagate into a PCB during the operation of an LSI involves integrating a device model of an LSI and so forth into a PCB equivalent circuit model, and executes a simulation based on the circuit analysis. The circuit analysis employs the node analysis method. This method is to solve a conductance relational expression with each nodal voltage regarded as an unknown quantity. The conductance relational expression is shown in the expression (101).

$$[G]\begin{bmatrix}V_1\\V_2\\\vdots\\V_n\end{bmatrix}=\begin{bmatrix}I_1\\I_2\\\vdots\\I_n\end{bmatrix}(G: n\times n \text{ matrix}) \quad (101)$$

Here, n signifies the number of nodes in the network, G signifies a n×n conductance matrix, and $V_1$ through $V_n$ and $I_1$ through $I_n$ each signify nodal voltages and nodal currents. When a computer solves this equation, at least the computer has to be provided with a memory capacity to store n pieces of nodal voltages and n×n pieces of the conductance matrix. In case of the network in FIG. 6, the total number of the elements in the nodal voltages and the conductance matrix 1 is 2577630. To store all of them with the single-precision type real number requires the memory capacity of 10310520 bytes (about 10 Mbytes).

In a complicatedly formed PCB as used in practical electronic equipment, if the equivalent circuit is created by means of the conventional technique, it will still more require the number of the meshes for calculating the equivalent circuit, in comparison to the case of the PCB in FIG. 3B. Therefore the number of nodes of the equivalent circuit and the number of branches become enormous. In consequence, the circuit analysis using the conventional technique requires much more memory capacity and analyzing time. If the memory capacity and analyzing time are restricted to a practically available size and period, a complicated modeling with a great number of elements will become impossible. Accordingly, the modeling will have to be a simplified one; the accuracy of analysis will become inferior.

SUMMARY OF THE INVENTION

A first object of the present invention is to provide a method of calculating an equivalent circuit that reduces the number of elements constituting a network to a large extent, while securing an intended accuracy.

A second object of the present invention is to reproduce the current and voltage distributions and so forth of an original complicated network by using the analyzed result of an equivalent circuit.

According one aspect of the invention, an equivalent circuit is calculated by a computer, with regard to an object that has a conductor, a dielectric to support the conductor, and plural input/output terminals to the outside, does not have sources and sinks of currents inside thereof, and satisfies the linearity and reciprocity to the input/output amounts of currents and voltages, and to the object such that the internal electric characteristics is invariable with time. Here, the information processing system receives inputs of geometry information to specify a shape of a conductor in a circuit board being the object of determining the equivalent circuit, and material information to specify a material of the circuit board. The system partitions the shape of the objective conductor into meshes, on the basis of the geometry information received, and creates and stores mesh data to be expressed. The system calculates a nodal admittance matrix from the mesh data, and stores the result. The system calculates a number of nodes and a number of independent networks on the basis of the mesh data, determines an incidence matrix to decide a connection of a tree structure that radially connects any of reference nodes to the other nodes, determines a structure of an equivalent network by means of the nodal admittance matrix and incidence matrix as calculated above, and determines values of elements of the equivalent network.

BRIEF DESCRIPTION OF THE DRAWINGS

FIG. 7 is an explanatory chart illustrating a part of data when a PCB equivalent circuit is outputted by means of the conventional technique in accordance with the data format of the universal circuit analysis software SPICE;

FIG. 10 is an explanatory chart illustrating an admittance relational expression in regard to the R elements of the PCB according to one embodiment of the invention;

FIG. 11 is an explanatory chart illustrating an admittance relational expression in regard to the L elements of the PCB according to one embodiment of the invention;

FIG. 13A is an explanatory chart illustrating the matrix relational expression that is calculated from the nodal admittance relational expression in one embodiment of the invention;

FIG. 13B is an explanatory chart illustrating the matrix relational expression that is calculated from the nodal admittance relational expression in one embodiment of the invention;

FIG. 13C is an explanatory chart illustrating the matrix relational expression that is calculated from the nodal admittance relational expression in one embodiment of the invention;

FIG. 14 is an explanatory chart illustrating a transformation result from the nodal admittance relational expressions in one embodiment of the invention;

FIG. 16 is an explanatory chart illustrating part of data according to one embodiment of the invention, when the computer outputted a PCB equivalent circuit in accordance with the data format of the universal circuit analysis software SPICE;

FIG. 23 is a chart to explain the matrix $C'$ that indicates positions of voltage sources to drive currents on the conductor surface, in one embodiment of the invention;

FIG. 24 is a chart for explaining the calculation of an equivalent circuit from the nodal admittance matrix, and explaining the correspondence of the node expression and the branch expression in the equivalent circuit and the determinant, and the relation between nodes and branches, in one embodiment of the invention;

DESCRIPTION OF THE PREFERRED EMBODIMENTS

The preferred embodiments will now be described with reference to the accompanying drawings.

The invention can be applied to a system that has plural input/output terminals to the outside, does not have sources and sinks of currents inside thereof, and satisfies the linearity and reciprocity in regard to the input/output amounts of currents and voltages and so forth, and that the internal characteristics is invariable with time. That is, the application of the invention is premised on the system that satisfies such conditions. A typical one that is applicable to such a system is a printed circuit board (PCB) having conductors. For example, the invention can be applied to the analysis of a PCB. In the examples hereunder, the description will be made on the PCB conductors as the object.

In the invention, a network is to be expressed by means of an equivalent circuit, in which an objective PCB conductor is composed of only input/output terminals to the outside, possesses circuit branches between the input/output terminals so as to form a tree structure in each of continuous elements of the system, and contains circuit elements to describe the mutual effects between the circuit branches. This network forms a tree structure, in which the circuit branches radially extend from the reference terminals to the other terminals in each of the continuous areas, which is expressed by branches composed of inductors and resistors connected in series, mutual inductances between the inductors, and mutual resistances between the resistors in the same continuous area.

By using the equivalent circuit expressed as such, a computer analyzes the response of the circuit. From a result of the analysis, the computer extracts the potentials and so forth of only the connection terminals to the outside, in the system that does not have sources and sinks of currents and so forth inside thereof, and the input amounts and output amounts from the terminals of the currents and so forth are always equal.

Using the potentials and so forth as the voltage sources and so forth, the computer is able to analyze the current distributions and so forth of the system before being replaced by the equivalent circuit.

The terminologies used in the embodiments, such as tree, branch, node matrix, incidence matrix and so forth, are well used and well known in the field of the network. As a reference document for these terminologies is 'Electric Circuit I—Basic/Alternate Current Edition' written by Takao Ozawa, pp125–197, Published by Syokodo. This document also includes suggestive descriptions as to the calculation method of the mathematical expressions explained in the embodiments.

Prior to describing the embodiments, the principle of calculating the equivalent circuit of the invention will be explained.

Figure 1:
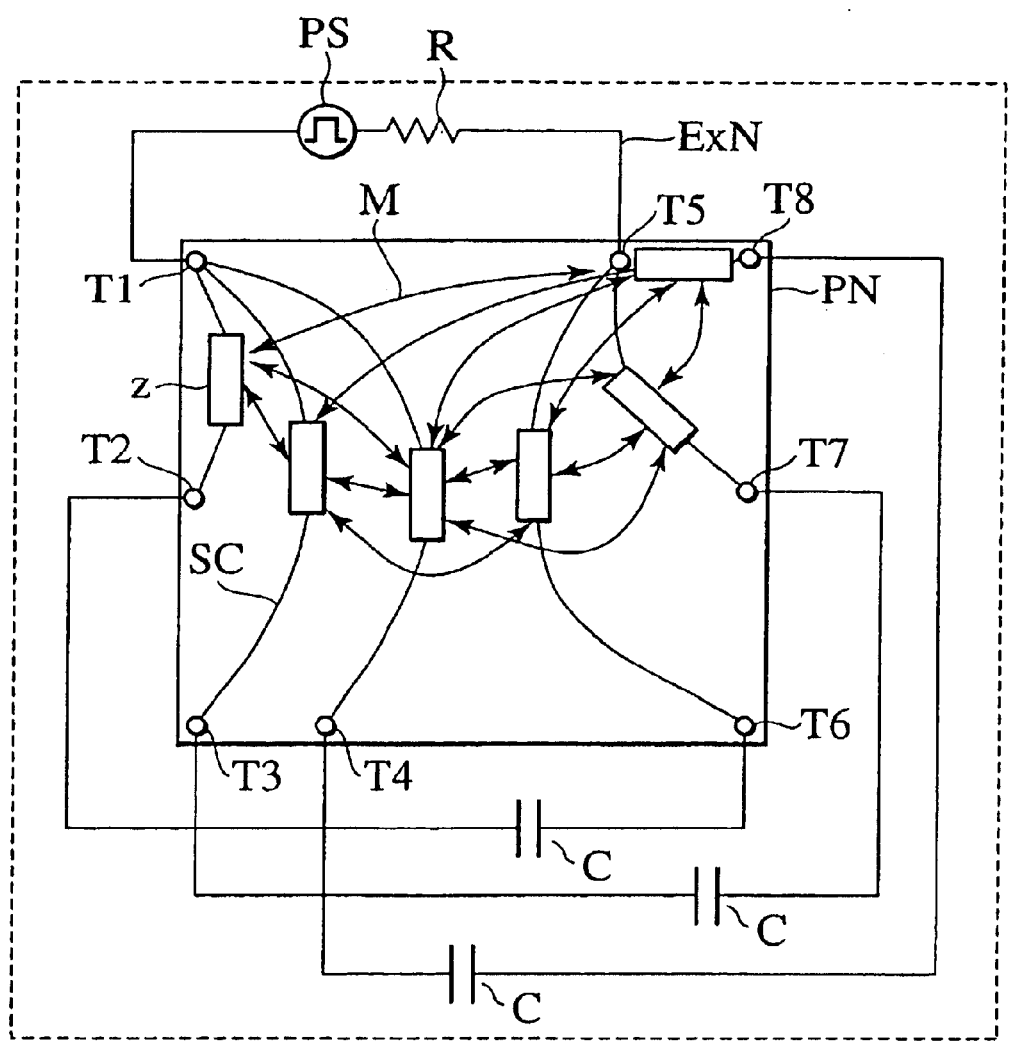
FIG. 1 is a circuit diagram that typically illustrates the equivalent circuit according to the first embodiment of the present invention.
Figure 2:
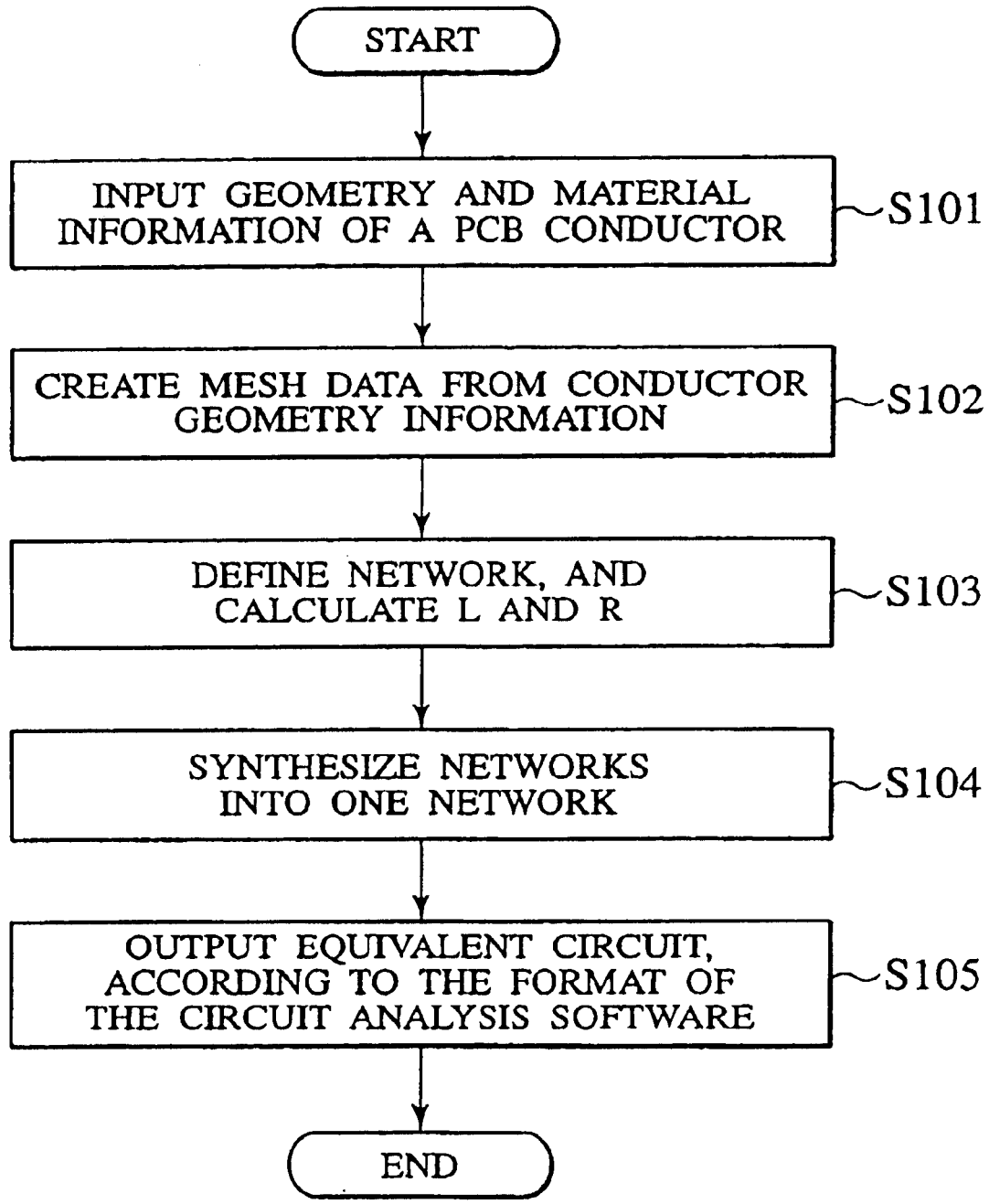
FIG. 2 is a flow chart that illustrates a procedure of creating an equivalent circuit according to the conventional PEEC method.
Figure 8A:
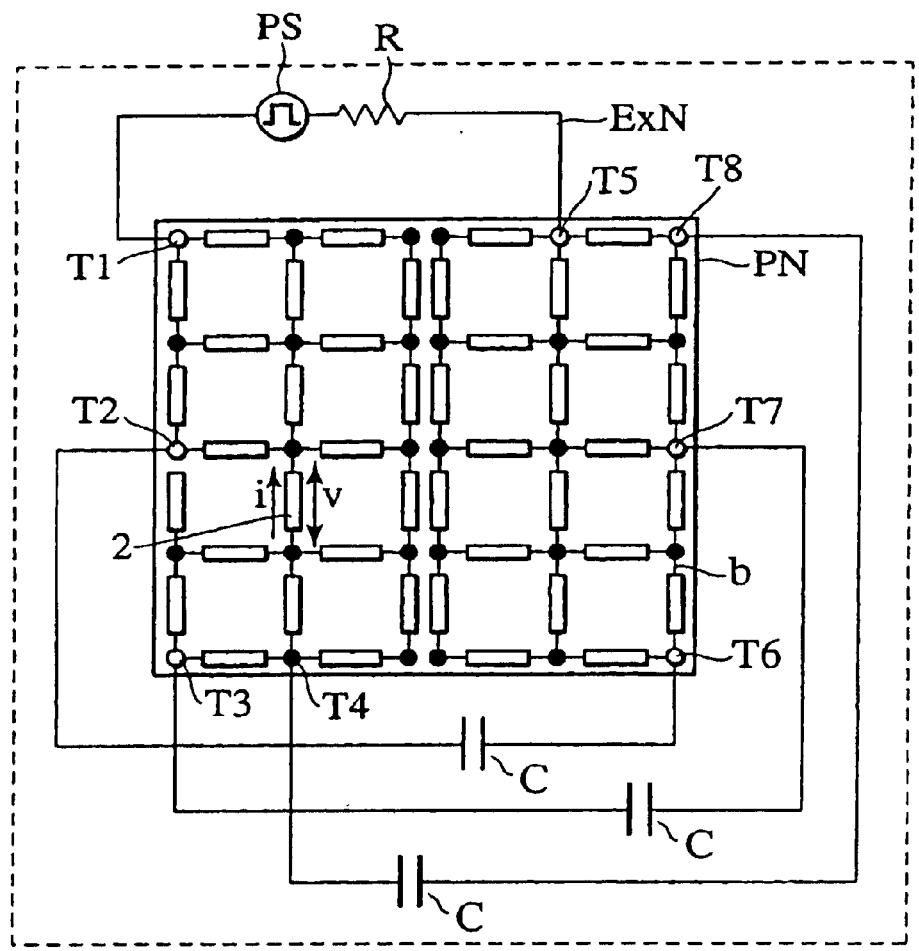
FIG. 8A is a circuit diagram typically illustrating a network in which an equivalent network by the conventional method is rewritten by the branches and elements being subtracted therefrom.
Figure 12:
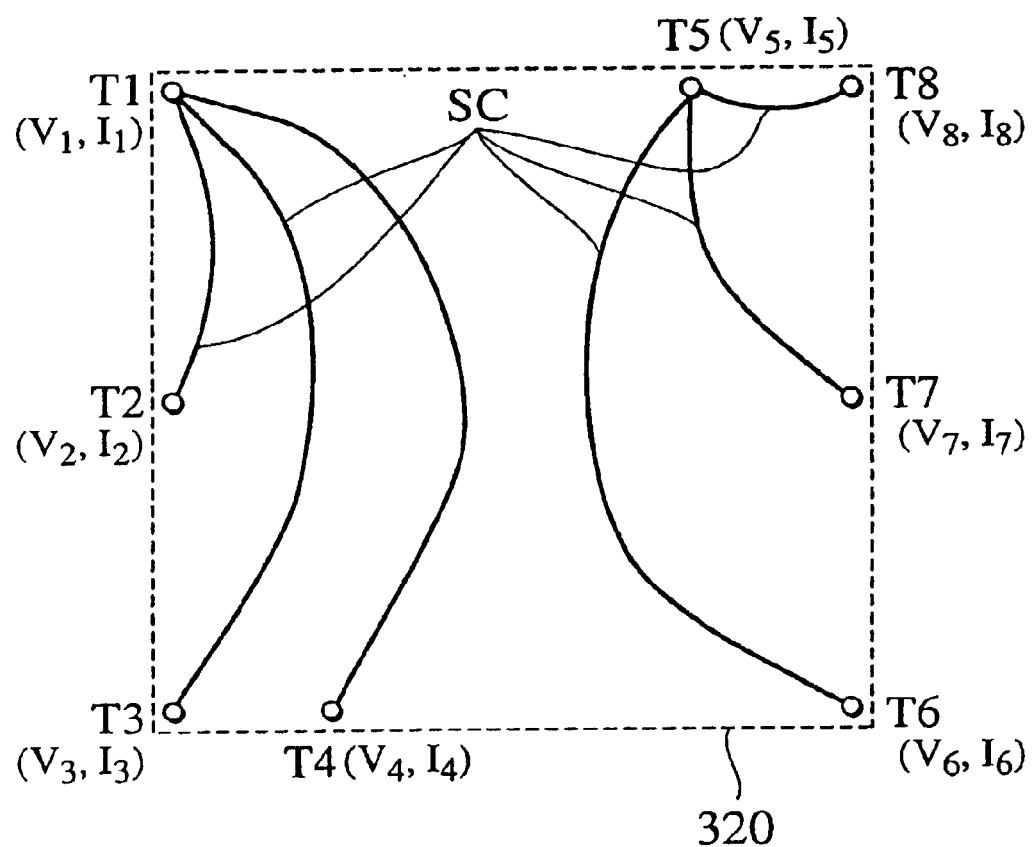
FIG. 12 is an explanatory chart illustrating the basic structure of a network in one embodiment of the invention, which is made up with circuit branches connecting reference circuit connection terminals to the other terminals.

FIG. 8A illustrates a partial network PN according to the conventional method, and an external network E×N connected to the network PN. On the other hand, FIG. 12 illustrates the basic structure of the equivalent circuit being the first embodiment of the invention, and FIG. 1 illustrates the equivalent circuit. FIG. 12 omits illustrating the external circuit, but has the same circuit connected, as shown in FIG. 8A. The partial network PN illustrated in FIG. 8A is transformed into the equivalent circuit illustrated in FIG. 1. As shown in FIG. 1, the equivalent circuit of the invention possesses the external connection terminals T1 through T8 being the connection nodes to the external circuits E×N, and does not possess any other connection nodes than these. And, there are circuit branches SC constituting an independent tree between these nodes (external connection terminals) T1 through T8, and mutual impedances INZ (mutual resistances R and mutual inductances L) between these circuit branches SC, whereby the basic structure is formed.

Next, the network in FIG. 8A before calculating the equivalent circuit is equal to the equivalent circuit in FIG. 1 according to the invention, which will be shown hereunder.

First, a matrix equation of network to a branch voltage v and branch current i will be calculated. The relation between the branch voltage v and branch current i in each branch of the internal circuit in FIG. 8A is given by the expression (1), by using the impedance z of a branch.

$$v = zi \quad (1)$$

Thereby, the matrix equation (2) is attained by means of a vector $v_v$ having each branch voltage in the component, and a vector $i_v$ having each branch current in the component (hereunder, the vectors accompany the suffix v, for the convenience of denotation).

$$v_v = Z i_v \quad (2)$$

Here, the diagonal elements of the matrix Z are the impedances z of each branch, and the other elements are the mutual impedances between each branches. The matrix Z is a normal matrix, which involves a reverse matrix $D_y$. Thereby, the matrix equation of the expression (2) is reduced to the expression (3).

$$D_y v_v = i_v, \quad D_y = Z^{-1} \quad (3)$$

Next, in regard to a nodal voltage V at each node and a nodal current I flowing into the node, the nodal matrix equation of the network will be attained. Now, an incidence matrix A to express the connection relation between the branch and the node of a network will be introduced. The column and the row of the matrix A correspond to the branch and the node of the network, respectively. And, if the branch of the number k comes out from the node of the number j, the component (j, k) of the matrix A becomes "1"; if in reverse the branch of the number k comes in, the component becomes "−1"; and in the other case, it becomes "0".

Figure 8B:
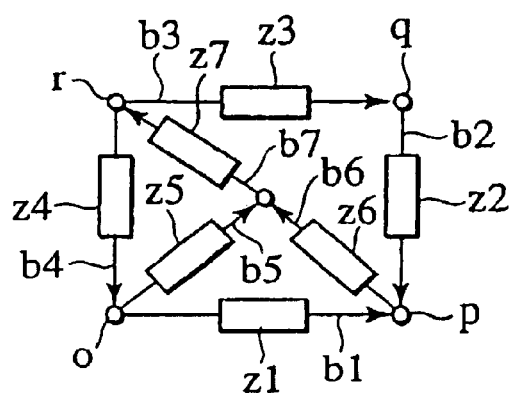
FIG. 8B is a circuit diagram typically illustrating a part of the equivalent network by the conventional method.

FIG. 8B illustrates a network having a part extracted from the partial network in FIG. 8A. In FIG. 8B, the symbols o, p, q, r, s signify the nodes of the partial network. The symbols b1 through b7 signify the branches of the network. The incidence matrix $A_{ex}$ with regard to the network in FIG. 8B is given by the expression (4).

$$\begin{array}{cccccccc} & b1 & b2 & b3 & b4 & b5 & b6 & b7 \end{array} \quad (4)$$

-continued $$A_{ex} = \begin{array}{c} o \\ p \\ q \\ r \\ s \end{array} \begin{bmatrix} 1 & 0 & 0 & -1 & 1 & 0 & 0 \\ -1 & -1 & 0 & 0 & 0 & 1 & 0 \\ 0 & 1 & -1 & 0 & 0 & 0 & 0 \\ 0 & 0 & 1 & -1 & 0 & 0 & -1 \\ 0 & 0 & 0 & 0 & -1 & -1 & 1 \end{bmatrix}$$

In the expression (4), each row of the incidence matrix $A_{ex}$ corresponds to each of the nodes o through s. Each column corresponds to each of the branches b1 through b7.

In the same manner, the incidence matrix to the partial network in FIG. 8A is defined as A. A vector (nodal voltage vector) having a nodal voltage in the component is given by $V_v$, and a vector (nodal current vector) having a nodal current in the component is given by $I_v$. And, the relation shown by the equation (5) is given by the incidence matrix A between the branch voltage vector $v_v$ and the nodal voltage vector $V_v$, and between the branch current vector $i_v$ and the nodal current vector $I_v$.

$$v_v = A^t V_v$$
$$A i_v = I_v \quad (5)$$

Here, the suffix t represents the transposition that the row component and the column component of the matrix are replaced. From the relation of the expression (5), the matrix equation (3) is transformed into the nodal equation (6).

$$A D_y A^t V_v = I_v \quad (6)$$

This is the relational expression between the nodal voltage vector V and the nodal current vector I, which is further replaced by the expression (7).

$$Y V_v = I_v$$
$$Y = A D_y A^t \quad (7)$$

Here, Y is called the nodal admittance matrix.

Next, the nodal matrix equation of the network will be contracted. In regard to the nodal matrix equation (7), the nodal voltage vector $V_v$ is divided into a nodal voltage vector $V_{vr}$ at a part connecting to the external circuit and a nodal voltage vector $V_{ve}$ at the internal node. In the same manner, the nodal current vector $I_v$ is divided into a nodal current vector $I_{vr}$ at a part connecting to the external circuit and a nodal current vector $I_{ve}$ at the internal node. When the nodal admittance matrix is divided into the partial matrixes corresponding to these, the nodal equation (7) is contracted to the expression (8).

$$\begin{pmatrix} Y_{11} & Y_{12} \\ Y_{21} & Y_{22} \end{pmatrix} \begin{pmatrix} V_{vr} \\ V_{ve} \end{pmatrix} = \begin{pmatrix} I_{vr} \\ I_{ve} \end{pmatrix} \quad (8)$$

From the expression (8), two nodal matrix equations (9), (10) are attained.

$$Y_{11} V_{vr} + Y_{12} V_{ve} = I_{vr} \quad (9)$$

$$Y_{21} V_{vr} + Y_{22} V_{ve} = I_{ve} \quad (10)$$

Since there do not exist sources and sinks of currents, the internal nodal current vector $I_{ve}$ not connecting to the external circuit becomes equal to zero. If $I_{vr}$ does not have a component that is constantly equal to zero, $Y_{22}$ will have a reverse matrix. Thus, the nodal voltage vector $V_{ve}$ not connecting to the external circuit is reduced to the expression (11).

$$V_{ve} = -Y_{22}^{-1} Y_{21} V_{vr} \quad (11)$$

From the expression (11), the nodal equation (6) can be contracted to the nodal equation (12) to only the nodes connecting to the external circuit.

$$Y'V_{vr} = I_{vr}$$

$$Y' = Y_{11} - Y_{12} Y_{22}^{-1} Y_{21} \quad (12)$$

Here, a contracted nodal admittance matrix to only the nodes connecting to the external circuit is given anew by Y'.

Next, a network to the contracted nodal matrix equation (12) will be determined, and the impedance matrix thereof will be attained. The network to the nodal matrix equation (12) will be the one in FIG. 1. The network in FIG. 1 possesses one node served as a reference at each connecting part. From this node, the branches extend to the other nodes at connecting parts so as to form the tree structure. Here, the nodal current vector $I_{vr}$ connecting to the external circuit is divided into a partial vector $I_{vk}$ at the reference node of a newly defined network, and a partial vector $I_{vn}$ at the nodes other than that. In the same manner, the nodal voltage vector $V_{vr}$ is divided into a partial vector $V_{vk}$ served as the reference of the network and a partial vector $V_{vn}$ at the nodes other than that. This is given by the expression (13).

$$V_{vr} = \begin{pmatrix} V_{vk} \\ V_{vn} \end{pmatrix}, \quad I_{vr} = \begin{pmatrix} I_{vk} \\ I_{vn} \end{pmatrix} \quad (13)$$

If a branch voltage vector to the newly defined network is $v_{v'}$, and if a branch current vector is $i_{v'}$, the relation between the nodal voltage vector $V_{vr}$ and the nodal current vector $I_{vr}$ will be given by the expression (14).

$$V'_v = V_{vk} - BV_{vn} \quad (14)$$

$$\begin{pmatrix} I_{vk} \\ I_{vn} \end{pmatrix} = \begin{pmatrix} i'_v \\ Bi'_v \end{pmatrix}$$

where B represents a nodal part served as a reference, and a matrix such that the reference nodal part takes the value "−1" as to each connecting element, and the others take the value "0". From the relation of the expression (5), the incidence matrix (this is defined as A') of the newly defined network is reduced to the expression (15).

$$A' = \begin{pmatrix} E_n \\ B \end{pmatrix} \quad (15)$$

where En signifies a unit matrix that represents a part other than a reference terminal of a partial network. And, the branch voltage vector $v_{v'}$ and the branch current vector $i_{v'}$ satisfy the relation of the expression (16) by means of the admittance matrix $D_y'$.

$$D_y' V_{v'} = i_{v'} \quad (16)$$

Using the relations of the expressions (14), (15), (16) will produce the expression (17) representing the nodal admittance matrix Y'.

$$Y' = \begin{pmatrix} D'_y & D'_y B^t \\ BD'_y & BD'_y B^t \end{pmatrix} \quad (17)$$

The expression (17) shows that the partial matrix of the nodal admittance matrix Y' is the admittance matrix $D_y'$ of a newly defined network, and the reverse matrix Z' of the admittance matrix $D_y'$ is an impedance matrix of the newly defined network.

$$v_v = Z' i_v \quad (17')$$

Next, the equivalent circuit will be deduced from the impedance matrix. The diagonal elements of the impedance matrix Z' represent self-impedances, and the other elements represent mutual impedances between the branches.

Net lists of the universal circuit analysis software SPICE can be created from the impedance matrix thus attained. Here, the PCB is supposed to be used in a sufficiently high frequency range. In a sufficiently high frequency range, the inductance element becomes dominant, which permits to neglect the effect by the resistance element. In that case, the impedance matrix Z' can be treated as an inductance matrix $D_z$.

In the inductance matrix $D_z$, the diagonal elements are the self-inductances of each branches, and the other elements are mutual inductances. The net lists of the universal circuit analysis software SPICE are composed of the self-inductances and the mutual coupling coefficients between the self-inductances. That is, assuming that the inductance matrix is given by $D_y = (d_{ij})$, the self-inductance is given by $L_i$, the mutual inductance between the self-inductance $L_i$, $L_j$ is given by $M_{ij}$, the mutual coupling coefficient is given by $K_{ij}$, the relations of the expressions (18), (19) can be attained.

$$L_i = d_{ii}, \quad M_{ij} = d_{ij} \quad (18)$$

$$K_{ij} = \frac{M_{ij}}{\sqrt{L_i \cdot L_j}} = \frac{d_{ij}}{\sqrt{d_{ii} \cdot d_{jj}}} \quad (19)$$

The net lists of the SPICE can be created from the inductance matrix, by using the relations of the expressions (18), (19).

Figure 5:
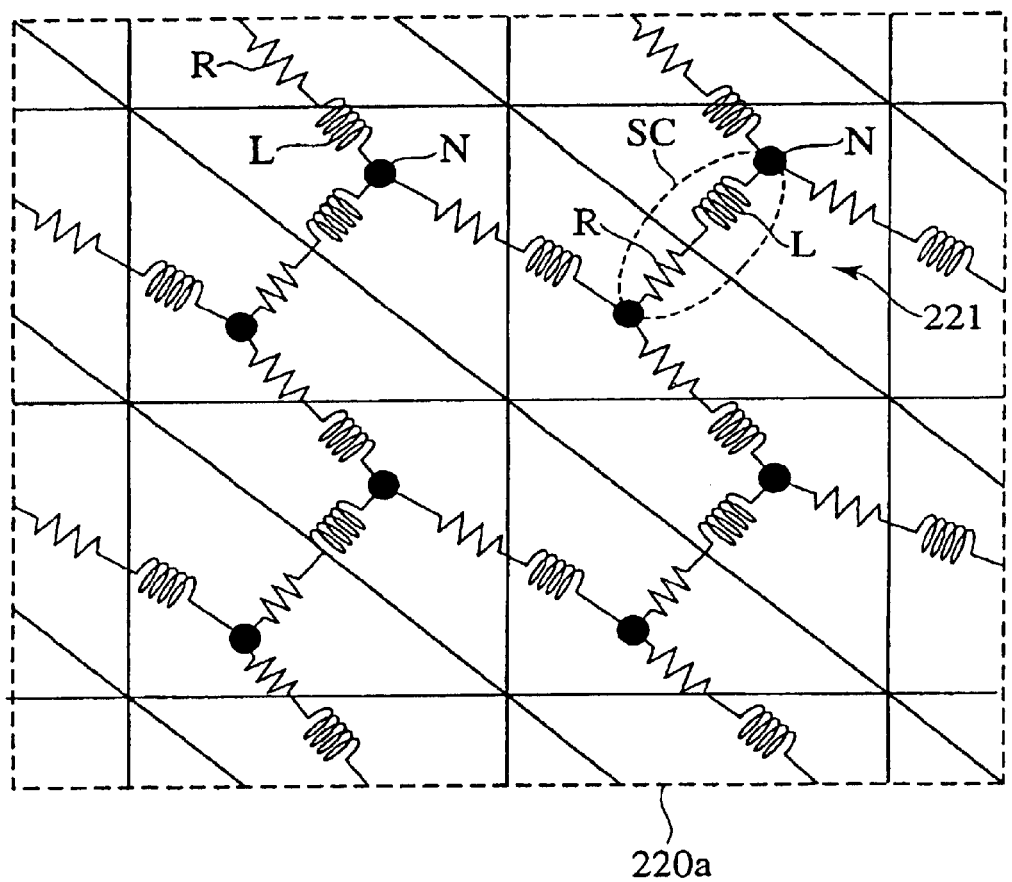
FIG. 5 is a circuit diagram illustrating a part of an example of the equivalent networks in the conventional technique, which is formed in a manner that nodes are laid out on the centers of triangular meshes and one node is connected to the three nodes on the centers of three triangular meshes adjoining to the one node.

In this manner, the partial network that does not possess the sources and sinks of currents and so forth inside thereof, which is composed of only the elements being a linear function and a function of the frequency only can be described by a network, in which the partial network is composed of only the nodes connecting to the external network other than the partial network, which has circuit branches between the nodes so as to form a tree structure for each connecting components between the nodes, and which includes circuit elements that describe the mutual effects between the network. And according to the aforementioned method, in regard to the partial network that does not possess the sources and sinks of currents and heats and so forth inside thereof, which is composed of only the elements being a linear function and a function of the frequency only, an equivalent circuit can be created, in which the partial network is composed of only the nodes connecting to the external network other than the partial network, which has circuit branches between the nodes so as to form a tree structure for each connecting components between the nodes, and which includes circuit elements that describe the mutual effects between the network. According to the conventional method, since the equivalent network depends on a model configuration, the number of elements that constitute the equivalent circuit becomes enormous with regard to a complicated configuration. However, this embodiment does not depend on a model configuration, and on a complicatedness of the original equivalent network. The equivalent circuit according to the conventional method illustrated in FIG. 5 involves 192 elements that constitute the network; on the other hand, the equivalent circuit according to the invention illustrated in FIG. 1 needs 6 elements and 15 mutual impedances, 21 in total, which reduced the number of elements of the equivalent circuit to 1/9. This effects shortening the analysis time, and reducing the quantity consumed of memory.

Now, the nodal matrix equation (7), the incidence matrix that determines the tree structure will further be explained.

When a network is configured with n pieces of nodes, and m pieces of branches, provided that m pieces of column vectors of an incidence matrix $A_p$ are represented by $a_i$, the incidence matrix A is given by the expression (20).

$$A = (a_1, a_2, \ldots, a_m) \tag{20}$$

Further, if the network is configured with k pieces of independent networks (however, there exist mutual effects between the networks), the total number of "trees" in the network is (n-k). If the "tree" is represented by a vector $t_i$, the column vector $a_i$ of the incidence matrix A can be expressed with the linear combination of the vector $t_i$ of the "tree". That is, using arbitrary real numbers $c_{li}$ will attain the relation of the expression (21).

$$a_i = \sum_{l=1}^{n-k} c_{li} t_l, \ (i = 1, 2, \ldots, m) \tag{21}$$

From this, the incidence matrix A can be expressed by the expression (22).

$$A = (t_1, t_2, \ldots, t_{n-k}) C, \ C = \begin{pmatrix} c_{1,1} & \cdots & c_{1,m} \\ \vdots & \ddots & \vdots \\ c_{n-k,1} & \cdots & c_{n-k,m} \end{pmatrix} \tag{22}$$

Therefore, the nodal admittance matrix Y is reduced to the expression (23) by using the relation of the expression (7).

$$Y = (t_1, t_2, \ldots, t_{n-k}) C D_y C^t (t_1, t_2, \ldots, t_{n-k})^t \tag{23}$$

Here, with regard to the incidence matrix and the admittance matrix of the network, provided that $A' = (t_1, t_2, \ldots, t_{n-k})$ and $D'_y = C D_y C^t$ are newly defined, the nodal admittance matrix Y is reduced to the expression (24).

$$Y = A D_y A' = A' D'_y A'^t \tag{24}$$

Here, the ECTAS describes the discrete current distribution on a conductor surface with the expression (25).

$$M\dot{T} + RT + C^t V = 0 \ \ J = CT \tag{25}$$

Here, J and T represent a current vector and a normal component of a current vector potential, respectively. And, C signifies a matrix that represents the relation between them. And, M and R signify an inductance matrix and a resistance matrix, respectively. $C^t T$ shows the effect of a voltage source connected to the conductor. The incidence matrix shown in the expression (22) relates a tree structure, which means that any network including plural supplementary trees can be contracted to a network composed of only the trees.

Now, the rank (this is described by RANK) of the nodal admittance matrix Y will be put on the discussion. The column vector of the incidence matrix A' is composed of (n-k) pieces of "tree" vectors, and the "tree" vector groups are all first order and independent. Therefore, the following relation is attained.

RANK $(A') = n-k$

Since the admittance matrix $D'_y$ of the network is a normal matrix of (n-k)×(n-k), the following is met.

RANK $(D'_y) = n-k$

Therefore, the rank of the nodal admittance matrix Y is given by the expression (26), which coincides with the total sum of the trees in the network.

$$\text{RANK }(Y) = \text{RANK }(A'D'_y A'^t) = n-k \tag{26}$$

Figure 20:
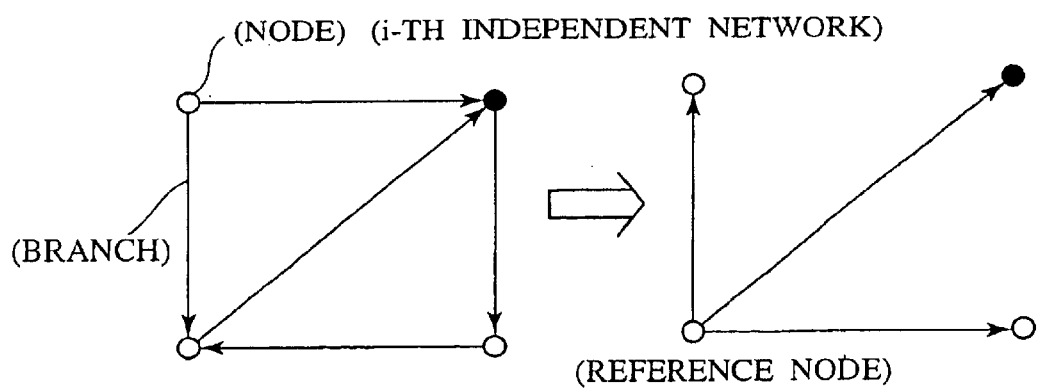
FIG. 20 is a chart illustrating a model of a tree-structured network, in one embodiment of the invention.

When an objective network is composed of n pieces of nodes and there exist k pieces of independent networks, the number of "trees" in this network is n-k. Therefore, the contracted incidence matrix A' is composed of (n-k) pieces of "tree" vectors. Here, with regard to i-th independent network is considered a network composed of only the "trees" such that the branches radially extend from the reference node to the other nodes. For example, from the network shown left in FIG. 20, the network shown right in the same drawing is contemplated which is composed of only the "trees" such that the branches radially extend. When all the independent networks constituting a circuit are the network as shown in FIG. 20, the incidence matrix A' can be given by the expression (27), by appropriately selecting the order of the nodes and the branches.

$$A' = \begin{pmatrix} E_{n-k} \\ B_k \end{pmatrix} \tag{27}$$

Here, $E_{n-k}$ signifies a unit matrix of (n-k)×(n-k), and $B_k$ represents a matrix such that the row elements corresponding to the reference nodes takes the value "−1" to each independent network, and the other elements take the value "0". The nodal voltage V is divided into a reference nodal part $V_k$ of k pieces of independent networks and the other parts $V_{n-k}$.

$$V = \begin{pmatrix} V_{n-k} \\ V_k \end{pmatrix} \tag{28}$$

By using the relations of the expressions (5), (6), (27), and (28), the nodal equation of the expression (7) is reduced to the expression (29), which attains the expression (30).

$$\begin{pmatrix} E_{n-k} \\ B_k \end{pmatrix} D'_y (E_{n-k}, B_k^t) \begin{pmatrix} V_{n-k} \\ V_k \end{pmatrix} = \begin{pmatrix} E_{n-k} \\ B_k \end{pmatrix} i \tag{29}$$

$$\begin{pmatrix} D'_y & D'_y B_k^t \\ B_k D'_y & B_k D'_y B_k^t \end{pmatrix} \begin{pmatrix} V_{n-k} \\ V_k \end{pmatrix} = \begin{pmatrix} E_{n-k} \\ B_k \end{pmatrix} i$$

$$\therefore D'_y (V_{n-k} + B_k^t V_k) = i \tag{30}$$

Considering $V_{n-k} + B_k^t V_k$, $B_k$ is the matrix such that the row elements of the reference nodes take the value "−1" with regard to each independent network, and $V_k$ is the voltage vector at the reference node, and $V_{n-k}$ is the voltage vector at the nodes other than that. Therefore, $V_{n-k}+B^t_k V_k$ relates the branch voltage vector v to the "tree" of the network. That is, the expression (30) relates the circuit equation (16) that describes the relation between the branch voltage and the branch current of the network.

When the nodal admittance matrix Y of an arbitrarily formed conductor is given, the calculation of concentrated constants of this conductor needs to obtain a transformation matrix P including the transposition of rows, to the nodal admittance matrix Y, which is reduced to the expression (31). In this case, the matrix P becomes the expression (32).

$$PY = \begin{pmatrix} E_{n-k} & B^t_k \\ O & O \end{pmatrix} \quad (31)$$

$$P = \begin{pmatrix} D'^{-1}_y & O \\ -B_k & E_{n-k} \end{pmatrix} G \quad (32)$$

Here, G signifies a matrix to represent transposition. Therefore, the $D'^{-1}_y$ elements of the matrix P constitute the impedance matrix $D_z$ to be sought. And, the network becomes a network corresponding to the contracted incidence matrix A', which extends branches radially from the reference nodes of each area.

Next, the embodiment of this invention that creates an equivalent circuit of a PCB will be discussed with the aforementioned principle.

Figure 21:
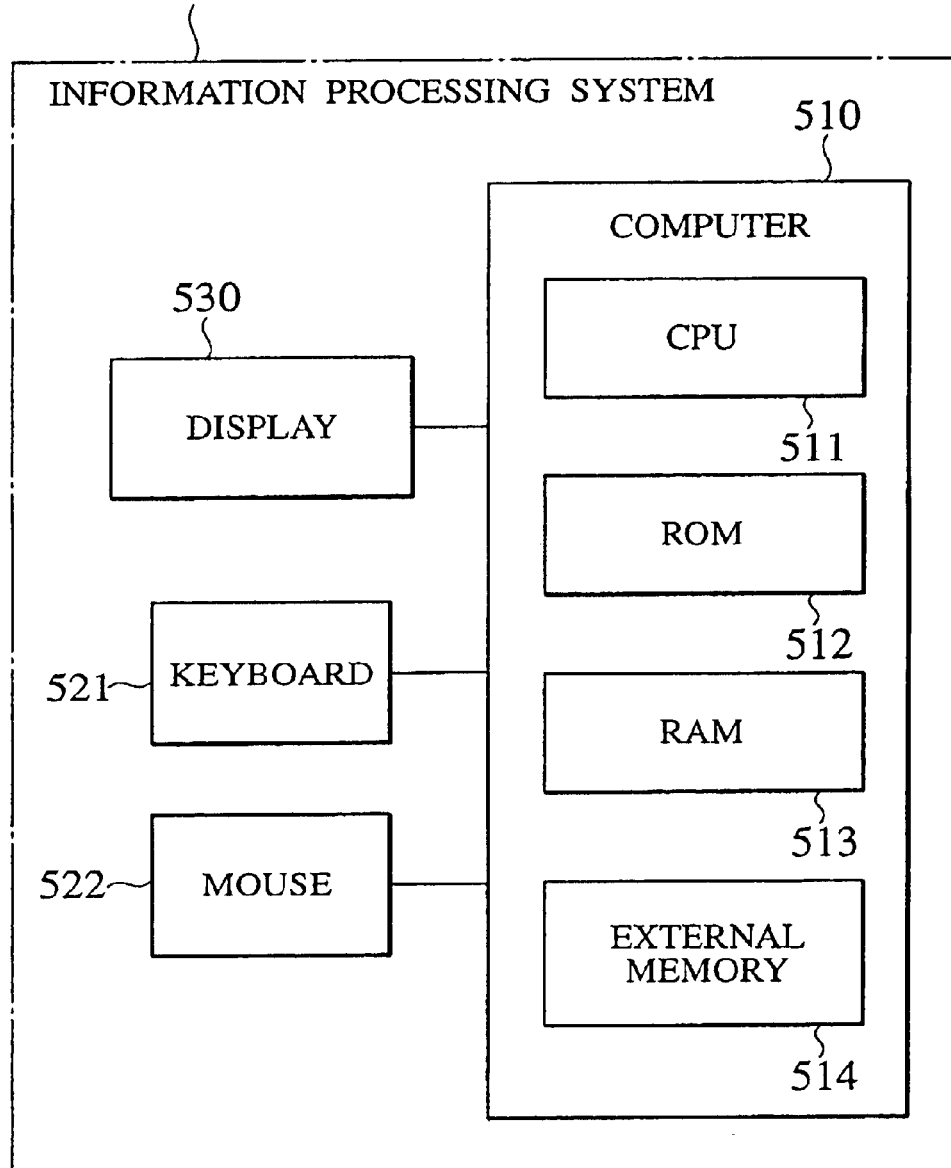
FIG. 21 is a block diagram illustrating a hardware configuration of the information processing system used for creating an equivalent circuit, in one embodiment of the invention.

FIG. 21 illustrates a hardware configuration of the information processing system used for creating an equivalent circuit in this embodiment. The information processing system 500 illustrated in FIG. 21 includes a computer 510, keyboard 521 and mouse 522, and a display 530. The computer 510 includes a central processing unit (CPU) 511, read only memory (ROM) 512, random access memory (RAM) 513, and external memory 514. The memory 514 is composed of, for example, a hard disk drive. The memory 514 stores various programs including the operating system that the CPU 511 executes, and data. The memory 514 stores, as part of various programs and data, the program for calculating the equivalent circuit of the invention, and necessary data to perform. The program to create the equivalent circuit includes a program that create mesh data from an objective conductor, a program that calculates the nodal admittance relational expression, a program that creates an equivalent circuit from the nodal admittance relational expression, and a program that outputs the equivalent circuit with the format of the circuit analysis software. Here, with regard to the program that create mesh data from an objective conductor and the program that outputs the equivalent circuit with the format of the circuit analysis software, it is possible to utilize the conventionally used programs, which is already mentioned.

Figure 9:
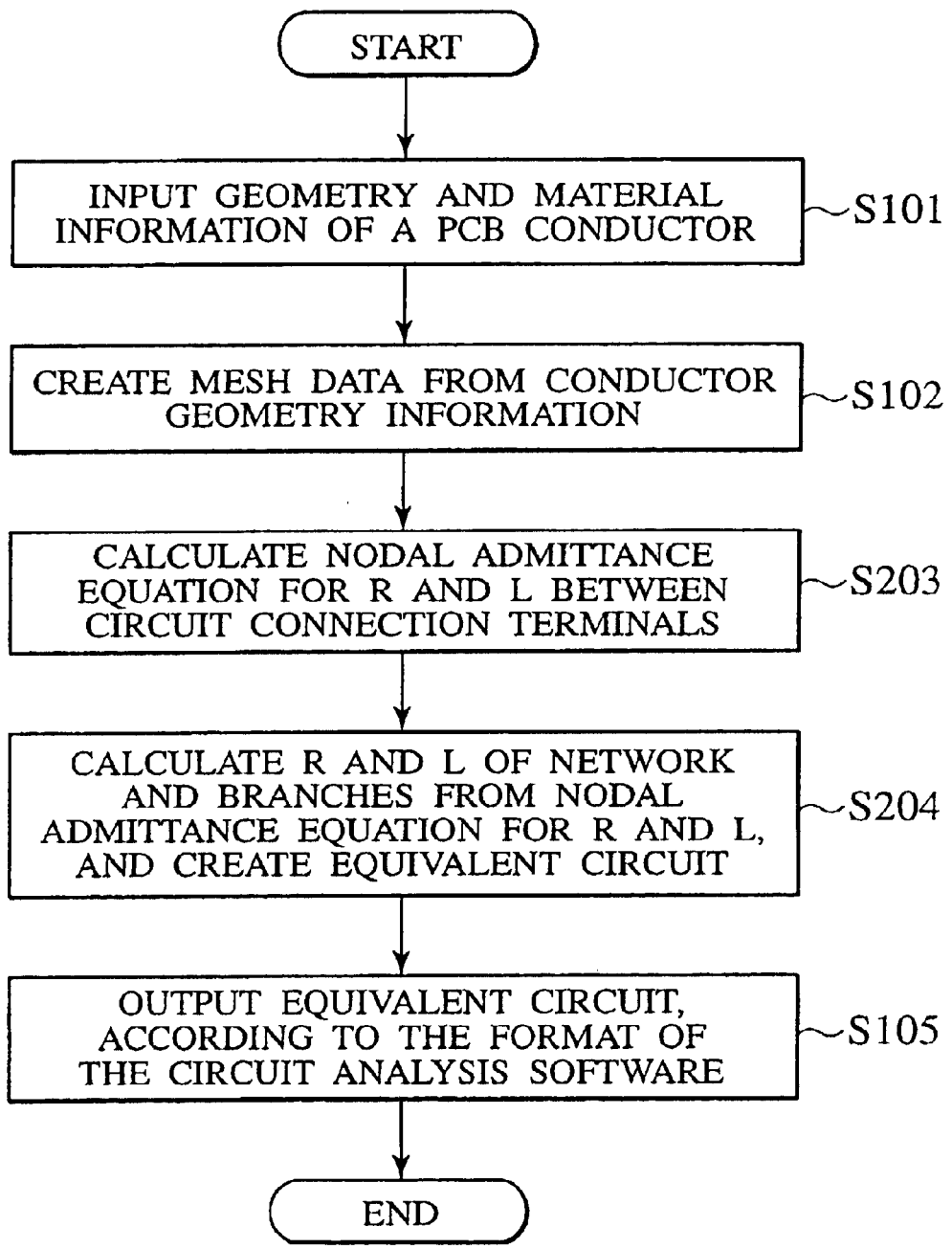
FIG. 9 is a flow chart illustrating one example of the procedure of creating an equivalent circuit according to one embodiment of the invention.

The computer 510 of the information processing system 500 in FIG. 21 executes these programs, and thereby creates an equivalent circuit according to a procedure as shown in FIG. 9. In other words, the computer 510 realizes: a means that receives the input of geometry information to specify a shape of a conductor in a circuit board being an object of determining the equivalent circuit, and the input of material information to specify a material of the circuit board; a means that partitions, on the basis of the geometry information received, the shape of the objective conductor into meshes to create and store mesh data; a means that calculates a nodal admittance matrix from the mesh data, and stores the result; a means that calculates the number of nodes and the number of independent networks on the basis of the mesh data, and determines an incidence matrix to decide a connection of the tree structure so as to radially connect any of reference nodes to the other nodes; a means that determines the structure of an equivalent network by means of the calculated nodal admittance matrix and incidence matrix; and a means that determines values of elements of the equivalent network.

Figure 3A:
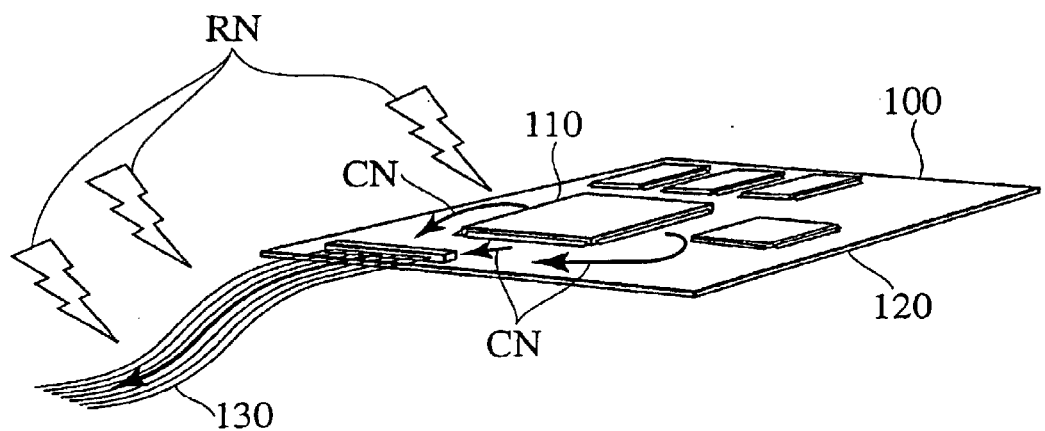
FIG. 3A is a chart explaining the mechanism that generates conduction noises and radiation noises.
Figure 3B:
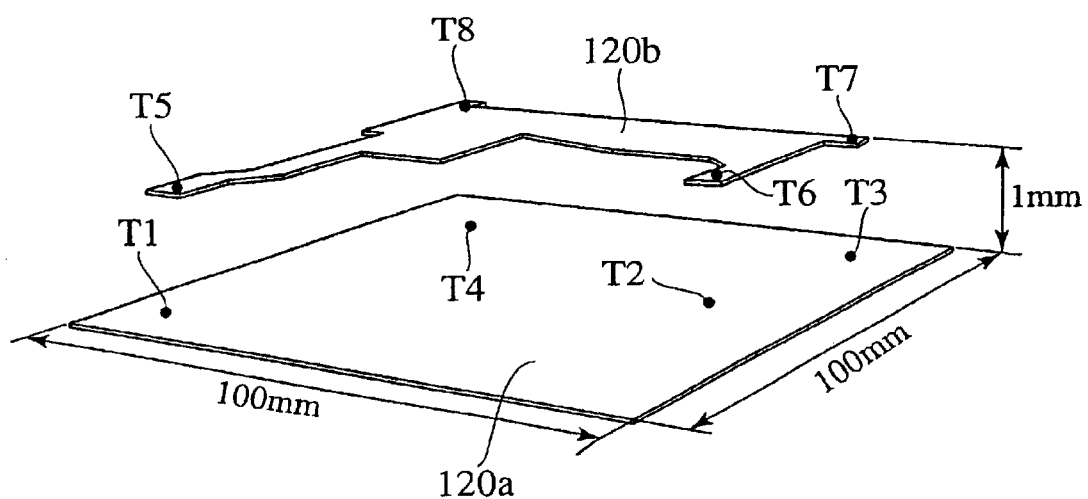
FIG. 3B is a perspective view illustrating the geometry of only the conductor of a PCB that received the input.

Next, the procedure of creating an equivalent circuit according to the first embodiment of the invention will be explained with reference to a flow chart illustrated in FIG. 9. The explanation here takes a case to create an equivalent circuit of a PCB having the same double-layer structure as the PCB illustrated in FIG. 3B. To simplify the explanation, however, a PCB having a different conductor layout form FIG. 3B is used for the case. It is assumed that the PCB possesses the external connection terminals T1 through T8, in which T1 through T4 are laid out on the first layer, and T5 through T8 are laid out on the second layer. For the convenience of explanation, it is also assumed that the first layer conductor and the second layer conductor do not overlap in the vertical layout.

In the workflow of calculating the equivalent circuit, illustrated in FIG. 9, at first, the flow executes the processing of "inputting the geometry and material information of the PCB conductor" at Step S101, and "creating mesh data from the conductor geometry information" at Step S102. These processing can be carried out in the same manner as the processing of the conventional technique. For example, the design data of a PCB is stored in the memory 514, and from the memory 514 are read out the design data of a conductor wiring relating to the PCB being an object of creating the equivalent circuit, and the specified material data. These processing are executed by receiving the instructions through the keyboard 521 and the mouse 522. The design data of a conductor wiring includes, for example, in a PCB 320 illustrated in FIG. 12, the external connection terminals T1 through T8, and the data that describe the shapes of conductor parts, which are not illustrated.

By means of CAD software and drawing software and so forth, receiving the operations by the keyboard 521 and mouse 522 and executing the drawing of a conductor layout on the PCB will enable receiving the inputs of the geometrical characteristics of the PCB conductor. Together with this, the inputs of the material information will be carried out. The information thus received are stored in the RAM 513, and are preserved in the memory 514.

Step S203 calculates the nodal admittance relational expression to the resistances (R) and the inductances (L) between the circuit connection terminals of the meshes that have been created at Step S102. FIG. 10 illustrates a nodal admittance relational expression (51) to the resistance elements of the PCB illustrated in FIG. 3B. FIG. 11 illustrates a nodal admittance relational expression (52) to the inductance elements of the PCB illustrated in FIG. 3B. Here, T1 through T8, and the suffix numbers of the nodal voltages V and nodal currents I, appearing on the row and column in FIG. 10 and FIG. 11, are correspondent with the circuit connection terminal numbers of the PCB in FIG. 12.

The nodal admittance relational expressions (51) and (52) relating to the resistance and inductance illustrated in FIG. 10 and FIG. 11 are obtained as follows.

By using the following equation (201) that defines the eddy currents, the basic equation will be deduced.

$$\frac{\partial}{\partial t}\left[\frac{\mu_0}{4\pi}\int\int\frac{j(r)j(r')}{|r-r'|}drdr'\right]+\frac{1}{\sigma}\int j(r)^2 dr+\int j(r)\nabla\Phi dr=0 \quad (201)$$

j: current density vector

φ: electric field scalar potential

In the equation (201), the electric charge distribution on the conductor surface is premised not to vary with time. That is, it is assumed that the following equation (202) is met with regard to the current density.

$$\nabla j(r)=0 \quad (202)$$

Thereby, the current density vector is given by the vector potential T. Further, if it is assumed that the current does not flow in a direction vertical to the conductor plane, the current density distribution is given by the following expression (203).

$$j(r)=\nabla\times T=\nabla T_n\times n \quad (203)$$

In the expression (203), the symbol n denotes the normal line vector to the conductor plane. The expression (203) confirms that the current density vector j can be expressed by the scalar potential $T_n$. Accordingly, by replacing j in the equation (201) by $T_n$, the digitizing of the current density will be carried out. When the current density is digitized, for example, into the triangular elements, on condition that the values at the vertexes of the triangle are $T_i$, $T_j$, $T_k$, the vector potential T in an arbitrary triangular element can be expressed as follows.

$$T = L_1 T_1 + L_2 T_2 + L_3 T_3 \quad (204)$$

$$\left[L_i = \frac{\Delta i}{2\Delta} \quad (i=1,2,3)\right]$$

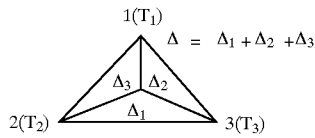

$\Delta = \Delta_1 + \Delta_2 + \Delta_3$ (Δ: represents the area)

The current density vector j is expressed with the vector potential T by the following expression (205).

$$j = T_1 e_1 + T_2 e_2 + T_3 e_3 \quad (205)$$

$$\left[e_1 = \frac{r_3 - r_2}{2\Delta} \quad e_2 = \frac{r_1 - r_3}{2\Delta} \quad e_3 = \frac{r_2 - r_1}{2\Delta}\right]$$

Thereby, the equation (201) can be digitized by the vector potential T as follows.

$$M\dot{T}+RT+C^t V=0 \quad (206)$$

In the equation (206), the matrix $C^t$ is a matrix that indicates positions of voltage sources to drive currents on the conductor surface. For example, as shown in FIG. 23, when the voltage at nodes ①-② is V1, and the current flowing in therefrom is I1, when the voltage at nodes ③-④ is V2, and the current flowing in therefrom is I2, and when the voltage at nodes ⑤-⑥ is V3, and the current flowing in therefrom is I3, the matrix $C^t$ is given by the following expression (207).

$$C^t = \begin{bmatrix} 0 & 0 & 0 \\ \vdots & \vdots & \vdots \\ 1 & 0 & 0 \\ -1 & 0 & 0 \\ \vdots & \vdots & \vdots \\ 0 & 1 & 0 \\ 0 & -1 & 0 \\ \vdots & \vdots & \vdots \\ 0 & 0 & 1 \\ 0 & 0 & -1 \end{bmatrix} \begin{matrix} ① \\ ② \\ ③ \\ ④ \\ ⑤ \\ ⑥ \end{matrix} \quad \begin{matrix} V1 & V2 & V3 \end{matrix} \quad (207)$$

The relation between the currents I1, I2, I3 that flow in from the voltage sources V1, V2, V3 and the current scalar potential T is given by the following expression (208).

I=CT $$(\dot{I}=C\dot{T}) \quad (208)$$

The deduction of the admittance matrix Y to the inductance and the resistance needs to solve the equation (206) by means of the eigenvalue solution method. Assuming that Γ represents an eigenvalue matrix, H an inherent vector matrix, and E a unit matrix, the eigenvalue problem of the following expression (209) will be contemplated.

$$\left.\begin{matrix} MH = RH\Gamma \\ H^t RH = E \\ T = Hu \end{matrix}\right\} \quad (209)$$

The expression (209) transforms the original matrix equation (206) into the equation (210).

$$\Gamma\dot{u}+u+H^t C^t V=0 \quad (210)$$

In the equation (210), u signifies the magnitude of each inherent mode when T is expressed with the linear combination of inherent vectors.

Multiplying the left side of the equation (210) by CHΓ$^{-1}$, and using the current relational expression (208) will produce the following expression (211).

$$\dot{I}=-CH\Gamma^{-1}H^t C^t V-CH\Gamma^{-1}u \quad (211)$$

The term of u in the expression (211) exhibits the effect of resistance. Thereby, the nodal admittance matrix $Y_L$ to the inductance is given by the following expression (212).

$$Y_L=-CH\Gamma^{-1}H^t C^t \quad (212)$$

Multiplying the left side of the equation (210) by CH will produce the following expression (213).

$$I=-CHH^t C^t V-CH\Gamma\dot{u} \quad (213)$$

The term of u in the expression (213) exhibits the effect of inductance. Thereby, the nodal admittance matrix $Y_R$ to the resistance is given by the following expression (214).

$$Y_R=-CHH^t C^t \quad (214)$$

Step S204 defines a network by the nodal admittance relational expression to the resistance and inductance elements, calculates the resistances R, mutual resistances, inductances L, and mutual inductances M of the branches, and creates an equivalent circuit. The network to be defined is a network such that the branches extend from one arbitrary terminal served as a reference on a continuous conductor to the other terminals on the same conductor. In this example, with regard to two continuous conductors composed of the first layer and the second layer, the circuit connection terminals T1 and T5 are selected as the references, respectively. The branches SC extend from the terminals T1 and T5 to the other circuit connection terminals on the same conductors, which forms a network provided with the circuit elements that describe the mutual effects between the circuit branches SC. FIG. 12 illustrates the network thus defined.

Now, the method of calculating an equivalent circuit from the nodal admittance matrix will be explained. The procedure is as follows.

(1) to calculate 'branch admittance matrix D' from 'nodal admittance matrix Y'.
(2) to calculate 'branch impedance matrix Z' from 'branch admittance matrix D'.
(3) to create an equivalent circuit from 'branch impedance matrix Z'.

Further, the relation between the nodes and the branches can be described as illustrated in FIG. 24.

Figure 25:
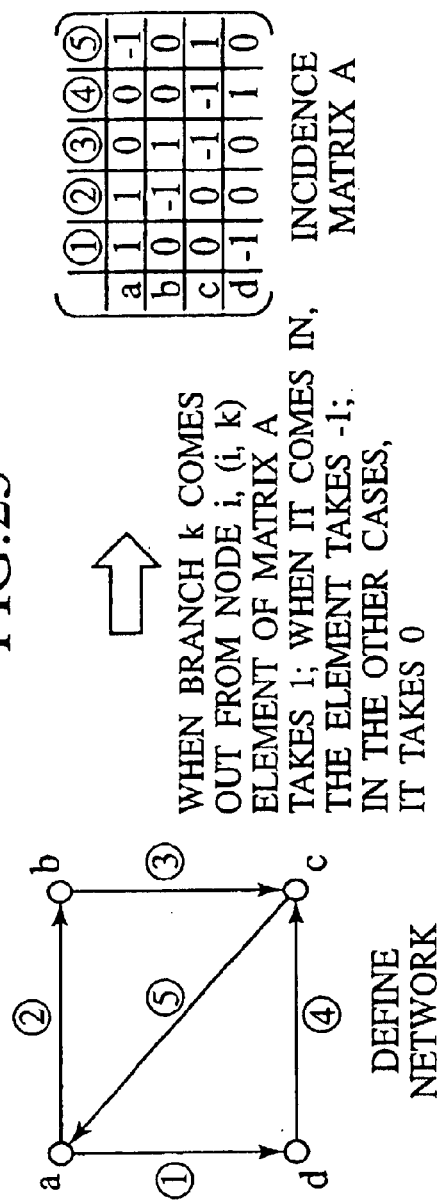
FIG. 25 is an explanatory chart illustrating the relation between the incidence matrix and the network, used in one embodiment of the invention.

The incidence matrix is a matrix to describe the connection relation between 'node' and 'branch', which is widely known as described in the aforementioned document (refer to FIG. 25). Without restrictions to the number of branches, the connection relation between the node and the branch has infinite combinations. If the column vector of the incidence matrix A is written as a, the connection relation is given by the following expression (215).

$$A=(a_1, a_2, \ldots, a_m) \qquad (215)$$

(the above expression is an incidence matrix with m pieces of branches)

Figure 26:
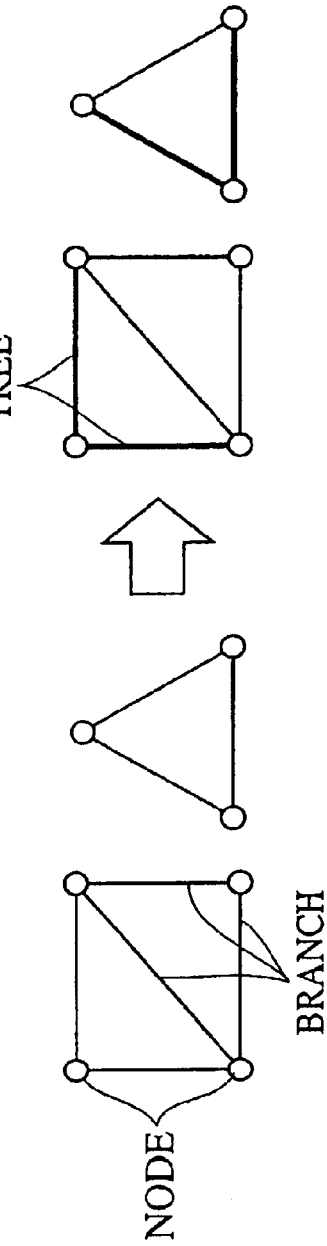
FIG. 26 is an explanatory chart illustrating the relation between the number of all nodes of a non-coupled network and the number of trees, in one embodiment of the invention.

Provided that the number of non-coupled networks (networks being not coupled by branches) is k and the number of nodes in all the networks is n, the number of independent branches (this is called 'tree') in the networks is n-k. As shown in FIG. 26, for example, when there are two non-coupled networks, the number of all the nodes is 7, and there exist trees of 7−2=5 pieces. Now, if the 'trees' of n-k pieces are defined as a vector t, the column vector a of the incidence matrix A can be described as the expression (216) by means of the linear combination of the tree vector t.

$$a_i = c_{ij} t_j \quad (i=1 \sim m, \; j=1 \sim n\text{-}k) \qquad (216)$$

Therefore, the incidence matrix A can be described as the following expression (217).

$$A = (t_1, t_2, \cdots, t_{n-k}) C \quad C = \begin{pmatrix} c_{11} & \cdots & c_{1,n-k} \\ \vdots & \ddots & \vdots \\ c_{n-k,1} & \cdots & c_{n-k,n-k} \end{pmatrix} \qquad (217)$$

Accordingly, the relation between the nodal admittance matrix Y and the branch admittance matrix D is reduced to the following expression (218).

$$Y = ADA^t = (t_1, t_2, \ldots, t_{n-k}) CDC^t (t_1, t_2, \ldots, t_{n-k})^t \qquad (218)$$

Here, the incidence matrix A and the branch admittance matrix D are newly transposed into the following expression (219).

$$A' = (t_1, t_2, \ldots, t_{n-k}) D' = CDC' \qquad (219)$$

Then, the relation between the nodal admittance matrix and the branch admittance matrix is given by the following expression (220).

$$Y = ADA' = A'D'A'^t \qquad (220)$$

Figure 27:
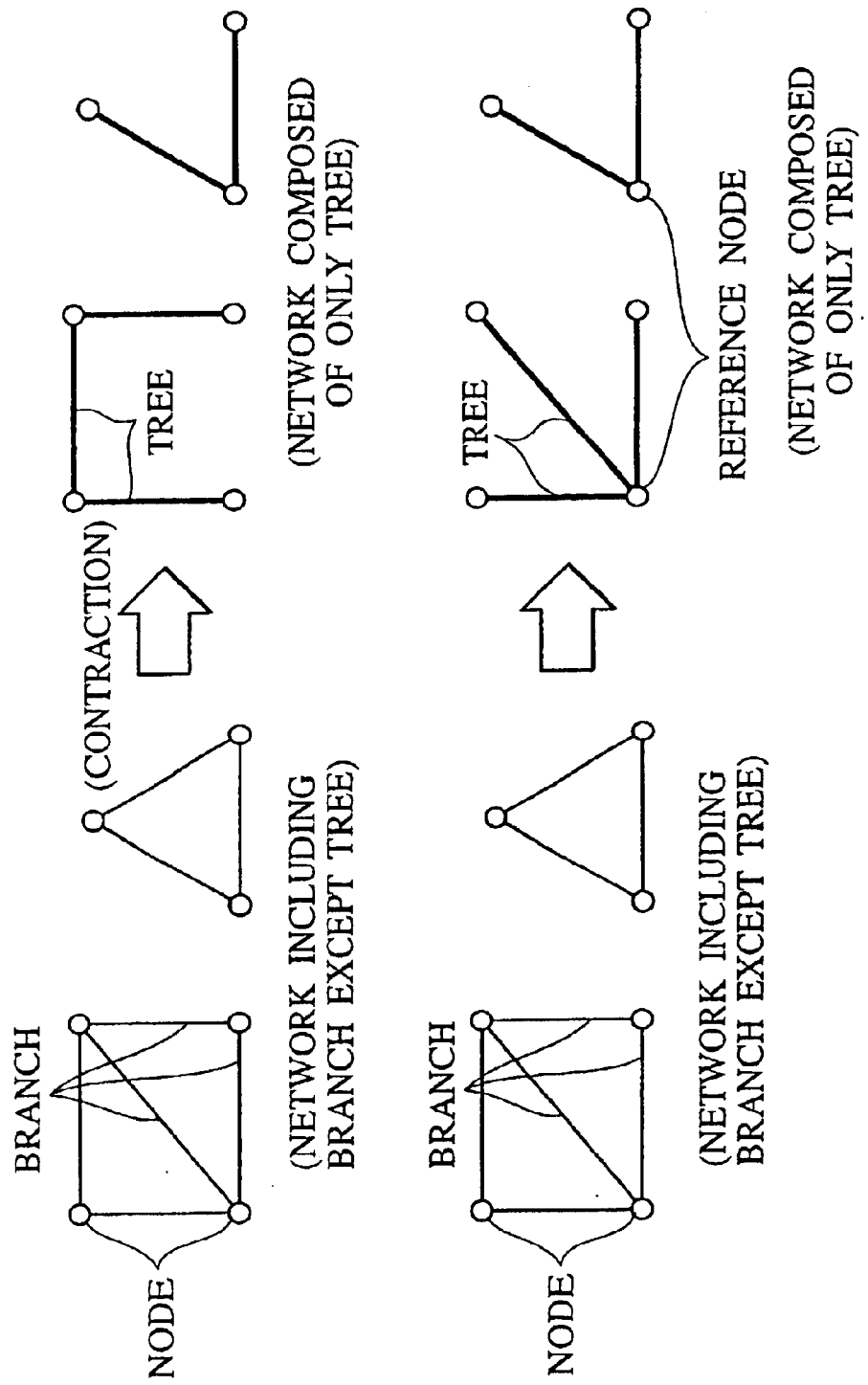
FIG. 27 includes charts explaining that any network including trees and branches can be contracted to a network composed of only trees, in embodiments of the invention.

This means that any network including branches other than trees can be contracted to a network composed of only trees (refer to FIG. 27(a), FIG. 27(b)). As a network composed of only trees, the reference nodes are selected in each of coupled networks, and the network that extends the branches from the reference nodes to the other nodes is selected. In case of the network composed of only trees in FIG. 27(b), the contracted incidence matrix becomes as follows.

$$A' = \begin{bmatrix} 1 & 0 & 0 & 0 & 0 \\ 0 & 1 & 0 & 0 & 0 \\ 0 & 0 & 1 & 0 & 0 \\ 0 & 0 & 0 & 1 & 0 \\ 0 & 0 & 0 & 0 & 1 \\ \hline -1 & -1 & -1 & 0 & 0 \\ 0 & 0 & 0 & -1 & -1 \end{bmatrix} \qquad (221)$$

Note at which the branch extends radially (unit matrix E)

Reference node of a coupled network (matrix B)

In this manner, the contracted incidence matrix A' is divided into two parts, as in the expression (222), a unit matrix E and a matrix B in which the reference node part of a coupled network is −1.

$$A' = \begin{pmatrix} E \\ B \end{pmatrix} \qquad (222)$$

Therefore, the relation between the nodal admittance matrix and the branch admittance matrix is given by the following expression (223).

$$Y = A'D'A'^t = \begin{pmatrix} E \\ B \end{pmatrix} D' (E \; B^t) = \begin{bmatrix} D' & D'B^t \\ BD' & BD'B^t \end{bmatrix} \qquad (223)$$

The partial matrix of the nodal admittance matrix Y is already the branch admittance matrix D. In order to deduce the equivalent circuit, however, the impedance matrix Z being the reverse matrix of the branch admittance matrix D has to be calculated. This needs to calculate the Rank of the nodal admittance matrix. When a Y matrix of the following expression (224) is given as the nodal admittance matrix, $$Y = \begin{pmatrix} D' & D'B^t \\ BD' & BD'B^t \end{pmatrix} \qquad (224)$$

multiplying the left side of the Y matrix by a transformation matrix P will produce a transformed matrix given by the following expression (225).

$$PY = \begin{pmatrix} E & 0 \\ 0 & 0 \end{pmatrix} \qquad (225)$$

In the expression (225), E is a unit matrix such that only the diagonal elements are 1 and the other elements are 0, and 0 is a matrix where all the elements are zero. The elements of the transformation matrix P are given by the following expression (226).

$$P = \begin{pmatrix} Z & 0 \\ -cB & cE \end{pmatrix} \quad (226)$$

(C represents arbitrary fixed number)

This confirms that the partial matrix of the transformation matrix P is the branch impedance Z to be sought.

Next, the equivalent circuit will be deduced from the branch impedance matrix Z. First, the branch impedance matrix Z will be explained. In case of a circuit illustrated in the following expression (227), the relation between the branch voltage v and branch current vector i, and the branch impedance matrix Z is described as follows.

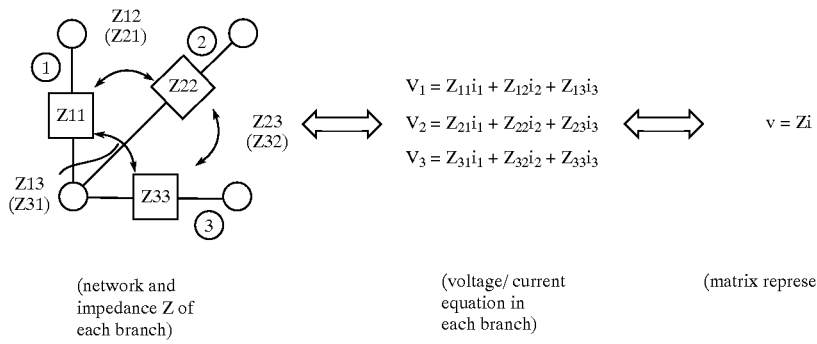

(227)

$V_1 = Z_{11}i_1 + Z_{12}i_2 + Z_{13}i_3$
$V_2 = Z_{21}i_1 + Z_{22}i_2 + Z_{23}i_3$
$V_3 = Z_{31}i_1 + Z_{32}i_2 + Z_{33}i_3$ $v = Zi$ (network and impedance Z of each branch)   (voltage/current equation in each branch)   (matrix representation)

The equivalent circuit can be attained from this branch impedance matrix Z.

According to the above method, the impedance matrixes Z to the inductances and resistances are each calculated. By the series connection of them, the equivalent circuit illustrated in FIG. 15 will be produced.

Figure 15:
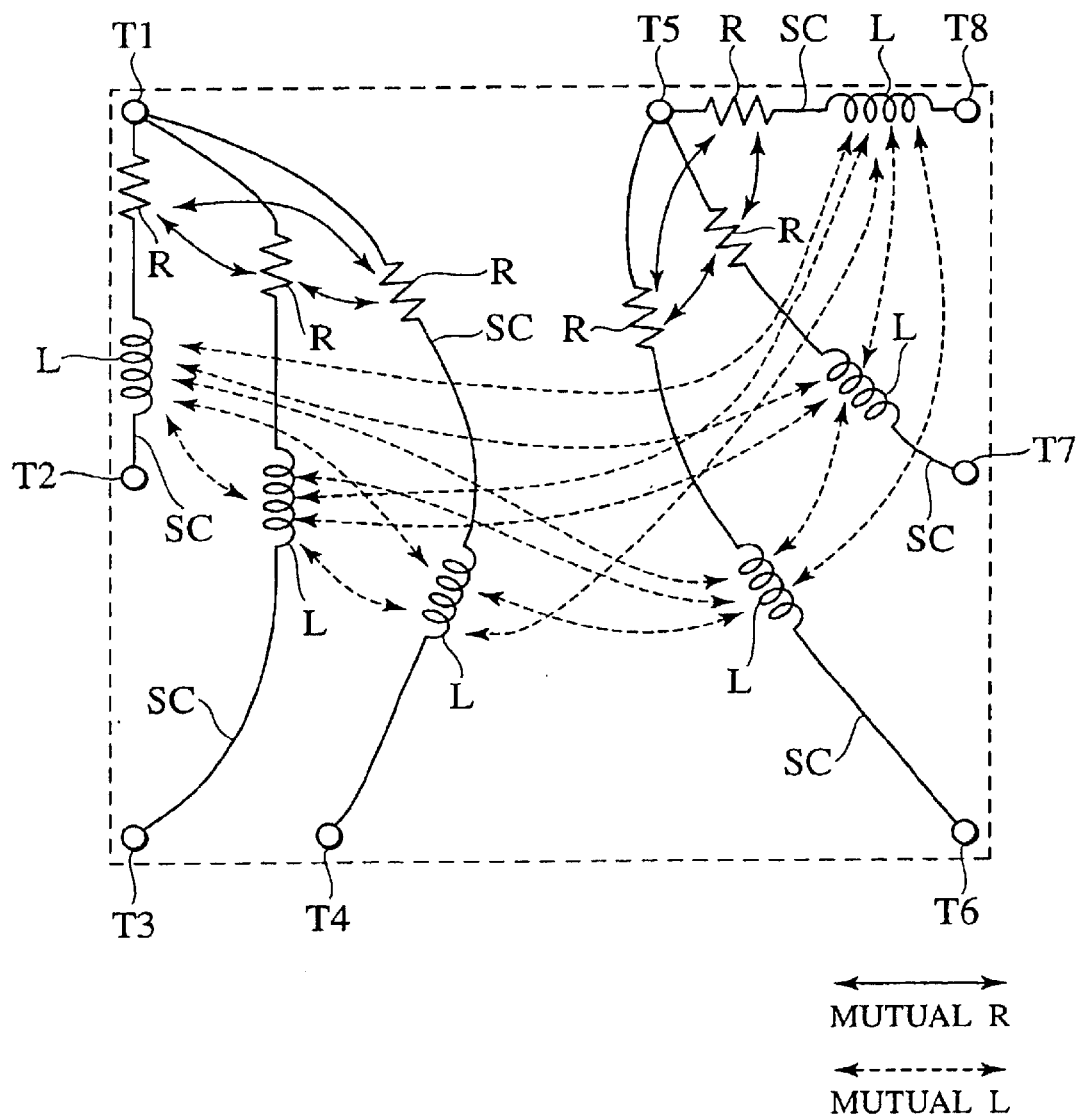
FIG. 15 is an explanatory chart illustrating the structure of an equivalent network obtained by one embodiment of the invention.

Next, in the network illustrated in FIG. 15, the resistance R and inductance L elements and the mutual effects between these of the impedance Z in each circuit branch SC will be calculated. First, the mutual effect elements between the R and each R will be calculated. In the nodal admittance relational expression (51) to the R elements shown in FIG. 10, the transformation is made according to the basic transformation of the matrix, in such a manner that the diagonal elements of the matrix corresponding to the terminals other than the reference terminals of each continuous conductors are 1.

Thereby, the matrix relational expression (53) as shown in FIG. 13A can be attained. This leads to two relational expressions (54) and (55), as shown in FIG. 13B and FIG. 13C.

The expression in FIG. 13B describes the relation between the branch voltages and the branch currents. The diagonal elements in the right side matrix correspond to the resistances R of each branch in the network in FIG. 12. The other elements in the matrix correspond to the mutual effects between the resistances R.

With regard to the nodal admittance relational expression (52) to the inductances L illustrated in FIG. 11, the same transformation is possible. The result of this transformation is shown in FIG. 14. The diagonal elements of the right side matrixes in the expression (56) shown in FIG. 14 give the inductances L of each branch in the network in FIG. 12. The other elements give the mutual inductances M between the inductances L.

Figure 4:
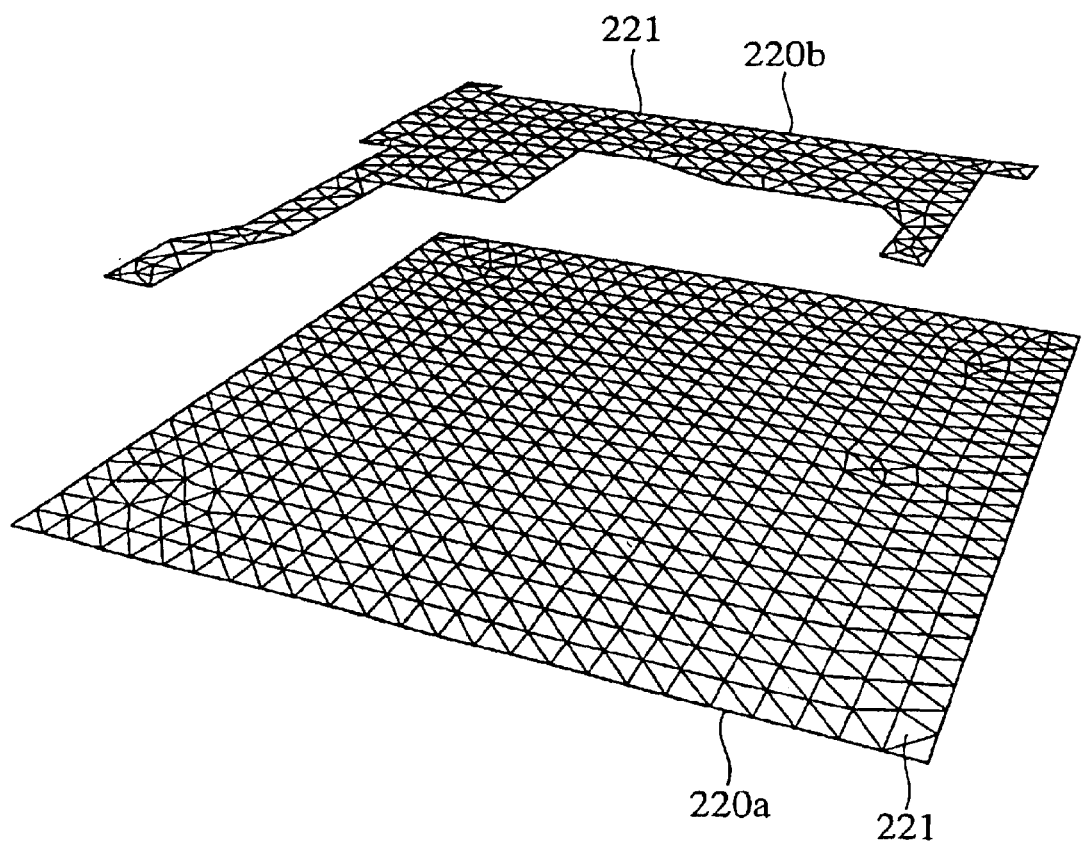
FIG. 4 is an explanatory chart that visibly illustrates the mesh data by the triangular element 221, the result that the conventional technique and the embodiment approximate the PCB conductor to the two-dimensional plane with the thickness ignored.

As the expression (54) in FIG. 13B describes, the mutual effects between the resistances exist only between the branches on the same conductor. On the other hand, as the expression (56) in FIG. 14 describes, the mutual inductances M between the inductances exist between all of the inductances. Thereby, with regard to the PCB as shown in FIG. 3B and FIG. 4, the equivalent circuit according to this embodiment is found to take a circuit configuration of the tree structure as shown in FIG. 15. Table 3 shows the number of nodes and the number of branches in the network illustrated in FIG. 15. Table 4 shows the numbers of R, mutual R, L, and M. In FIG. 15, three circuit branches SC extend from the connection terminal T1. Each circuit branch SC has a resistance R and an inductance L connected in series. The solid line arrows illustrated between the resistances R show the mutual effects between the resistors. The dotted line arrows illustrated between the inductances L show the mutual inductances between the inductors.

TABLE 3

Number of nodes and branches in
the equivalent circuit illustrated in FIG. 15

| Number of nodes | 8 |
|---|---|
| Number of branches | 6 |

TABLE 4

Number of R, mutual R, L, M in the equivalent
circuit illustrated in FIG. 15

| R | 6 |
|---|---|
| Mutual R | 6 |
| L | 6 |
| M | 15 |

Step S105 outputs the equivalent circuit, according to the data format of the circuit analysis software. FIG. 16 illustrates part of data when the computer outputted the equivalent circuit relating to the PCB in FIG. 3B in accordance with the data format of the universal circuit analysis software SPICE. Here, the data Dt6 shows the names of circuit connection terminals, and the last number corresponds to the terminal number. The data Dt7 shows the voltage source data for current references.

The data Dt8 shows the data of resistances R and inductances L in each branch of the network. The data Dt9 shows the mutual inductances M between inductances L each in the circuit branches. The data Dt10 shows the mutual resistances between resistances R each in the network.

Figure 6:
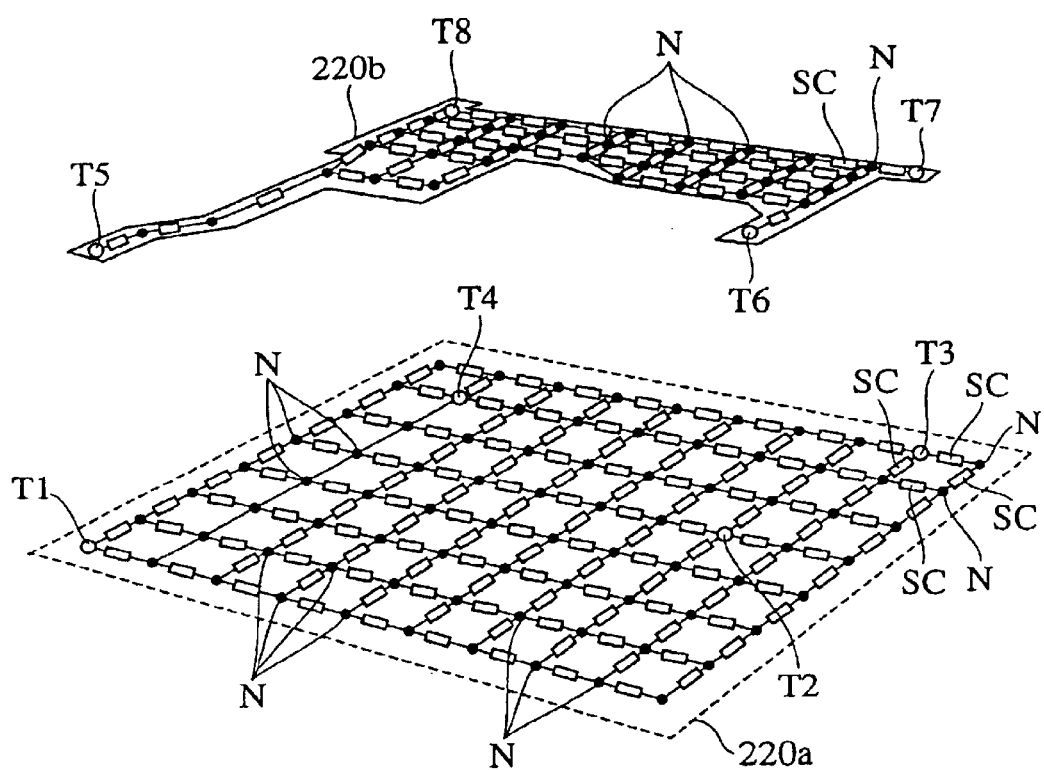
FIG. 6 is an explanatory chart illustrating a network composed of R, L, M that is calculated to a PCB by means of the conventional technique.

The equivalent circuit thus achieved assumes an extremely simple structure, as shown in FIG. 15, that two sets of the tree-structured three circuit branches are laid out each between four connection terminals. This network is very simple, compared with the network of the complicated mesh structure illustrated in FIG. 6. Accordingly, the calculation quantity to establish this network is very limited. The analysis of the circuit performances by using the network also becomes simple, and the calculation quantity can be reduced.

Next, the second embodiment relating to the invention will be described. In this embodiment is shown a case that executes the circuit analysis by using the equivalent circuit attained according to the foregoing method.

Figure 17:
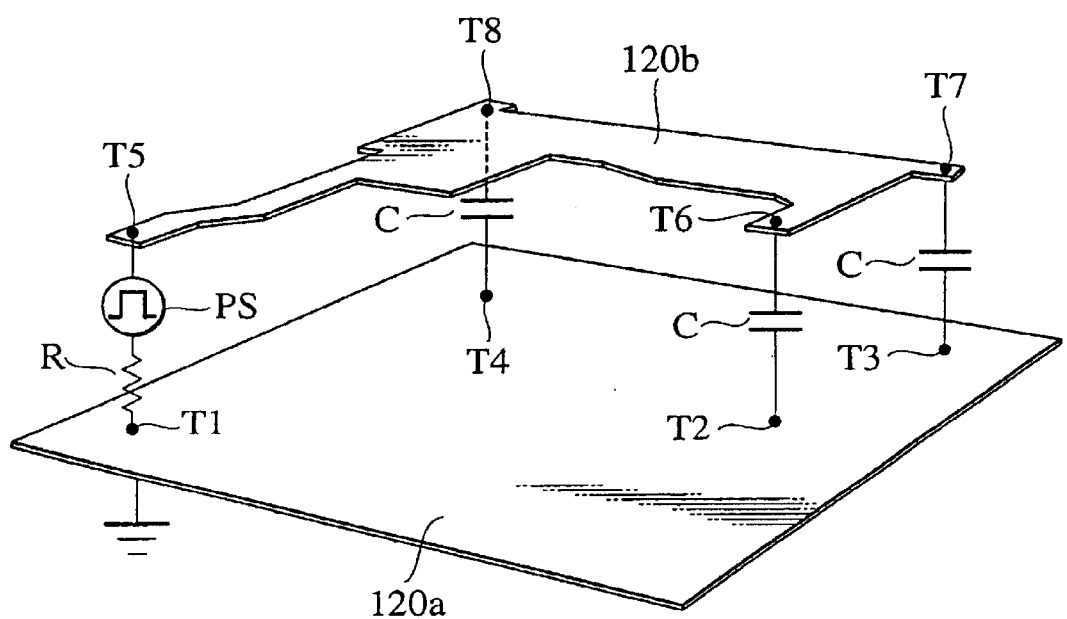
FIG. 17 is an explanatory chart illustrating a network image by the circuit analysis in one embodiment of the invention, which used the equivalent circuit to the PCB in FIG. 3B.
Figure 18:
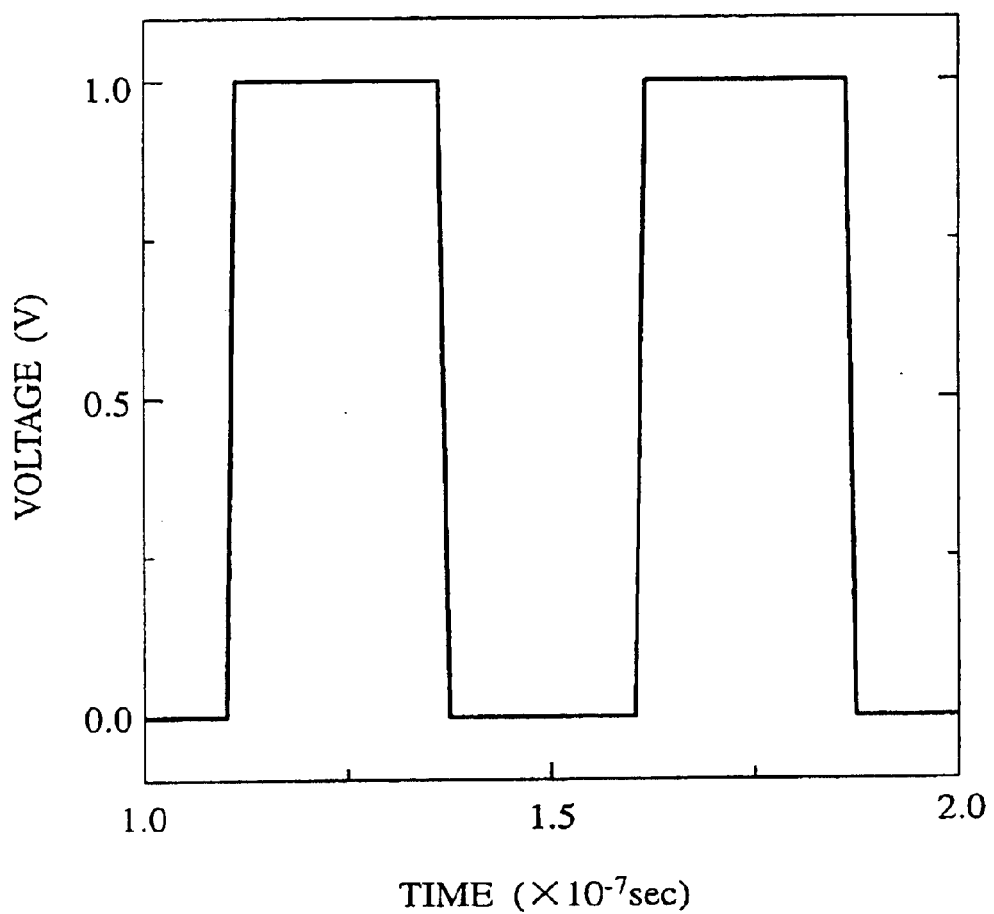
FIG. 18 is a chart illustrating a voltage waveform of the voltage source PS in the circuit analysis that used the equivalent circuit according to this embodiment.
Figure 19:
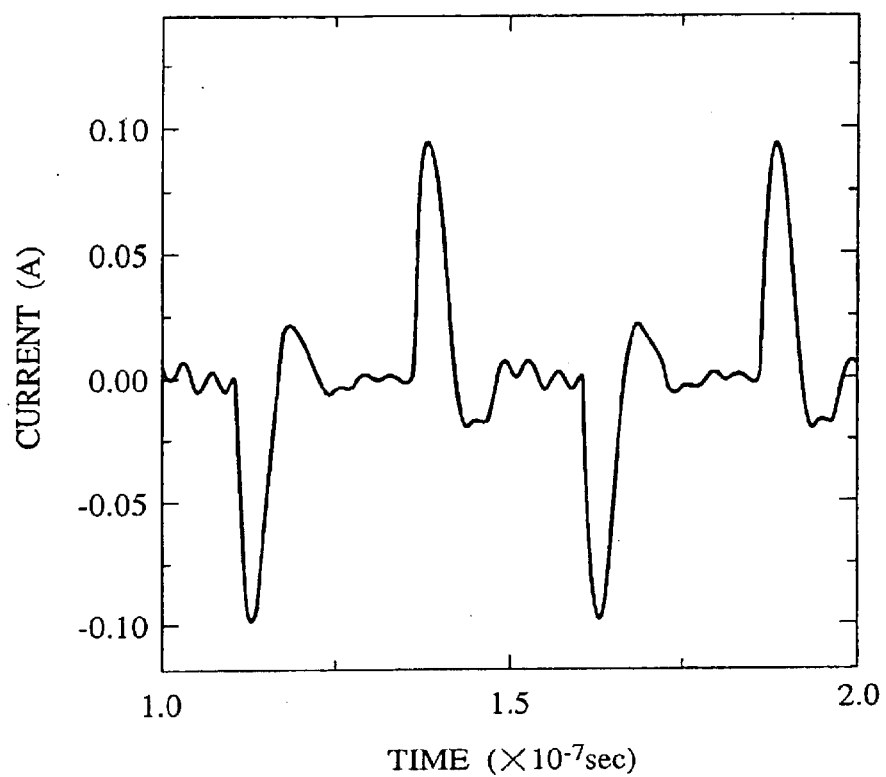
FIG. 19 is a chart illustrating a current waveform that flows through the voltage source PS, in one embodiment of the invention.

FIG. 17 illustrates a network image by the circuit analysis that used the equivalent circuit to the PCB in FIG. 3B. As shown in FIG. 17, a square-wave voltage source PS and a resistor R are connected in series between the terminals T1 and T5. Capacitors C of the same capacitance 0.1 nF are each connected between the terminals T2 and T6, between T3 and T7, and between T4 and T8. The resistor R has a resistance, for example, 5Ω. FIG. 18 illustrates a voltage waveform of the voltage source PS in the circuit analysis that used the equivalent circuit according to this embodiment. FIG. 19 illustrates a current waveform that flows through the voltage source PS. From the current waveform in FIG. 19, even a simple network composed of the voltage source, resistors, and capacitors is found to produce a complicated current waveform, depending on the shape of the conductor.

Figure 22A:
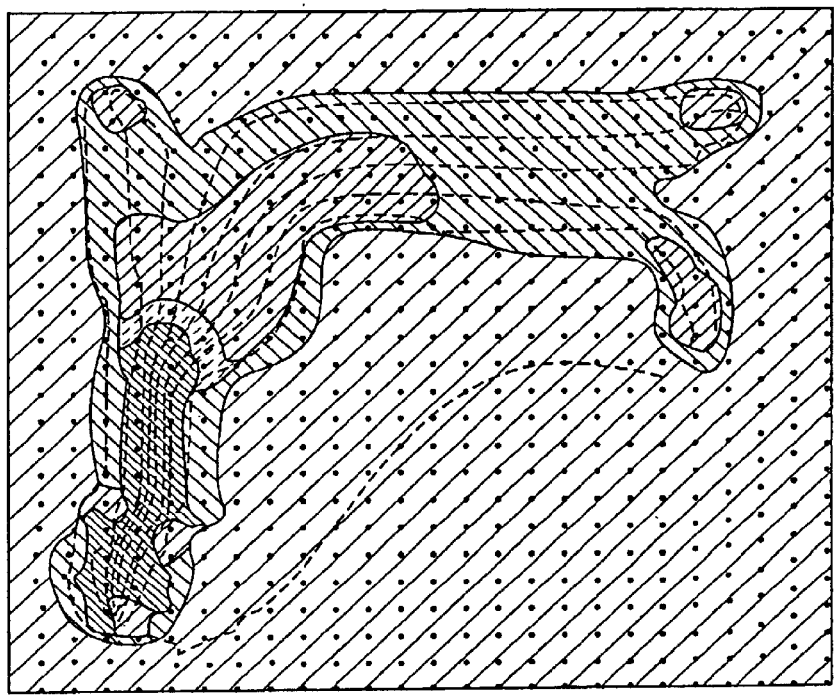
FIG. 22A is an explanatory chart illustrating the current distribution by the computer simulation performed by using the equivalent circuit according to the invention.
Figure 22B:
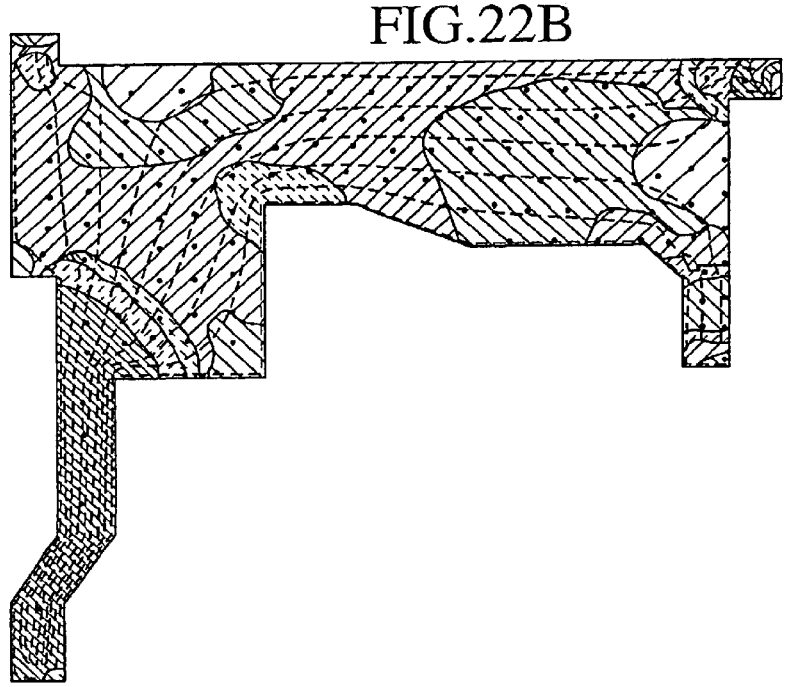
FIG. 22B is an explanatory chart illustrating the current distribution by the computer simulation performed by using the equivalent circuit according to the invention.

This circuit analysis calculates voltage values at the external connection terminals T1 through T8 at each interval of time. The voltage sources having these voltage values are connected to, for example, the external connection terminals in the PCB in FIG. 3B, and the current distribution in this state can be reproduced by means of a computer simulation such as the finite element method and the method of moment. Thus, the current distribution in the PCB can be reproduced in the state that the voltage source and the circuit elements of the capacitors and so forth are connected to the external terminals. FIG. 22A and FIG. 22B illustrate the computer simulation results of the current distribution on the PCB. In FIG. 22A and FIG. 22B, the solid lines each show the current flow lines.

Figure 28:
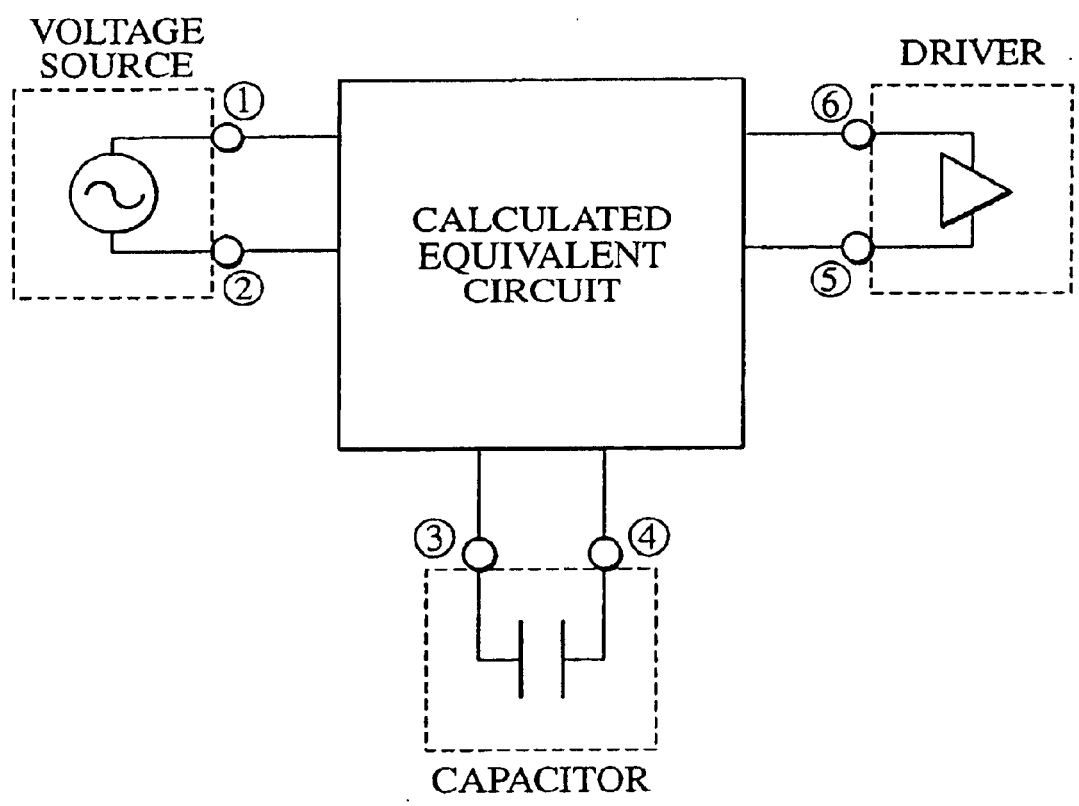
FIG. 28 is an explanatory chart illustrating a state in which a voltage source and so forth are connected to the nodes on the conductor in order to reproduce the current distribution on the conductor from the calculated equivalent circuit, in one embodiment of the invention.

The method of reproducing the current distribution on the conductor will be explained in brief. First, the calculated equivalent circuit is combined with element models such as a voltage source, capacitor, and driver, and the circuit analysis is carried out. As shown in FIG. 28, for example, a voltage source, capacitor, and driver are connected to the nodes ① through ⑥ of the calculated equivalent circuit. Then, in regard to the analysis of the frequency domain and time domain, the voltages V at the nodes ① through ⑥ of the equivalent circuit are calculated. With regard to the frequencies and times, the voltages V at the nodes are regarded as the voltage sources connected to the equivalent circuit, and the current vector T is calculated by using the aforementioned expressions (205), (210), whereby the current distribution on the conductor can be reproduced.

Next, the circuit analysis using the equivalent circuit according to the invention will be compared with the circuit analysis using an equivalent circuit according to the conventional technique. First, the minimum memory capacity required for the circuit analysis will be compared. In case of the equivalent circuit according to the invention, the total number of elements of the nodes and conductance matrixes is 72. This shows that the minimum memory capacity required for the circuit analysis is 288 bytes, in case of the single-precision type variables (4 byte). This value corresponds to about $1/33800$, against the case (about 10 Mbytes) of the equivalent circuit according to the conventional technique. Further, the high-speed analysis is realized, because the variables handled in the analysis are very few compared to the conventional technique. Besides in this invention, even if a complicated modeling having a great many meshes is made in order to enhance the accuracy of the equivalent circuit, the number of the networks constituting the equivalent circuit will be a square size of the number of circuit connection terminals on the conductor, which does not make a big difference. Thereby, it is possible to create a higher-accuracy equivalent circuit with a smaller-scale network than that of the conventional technique.

In other words, when the method of this invention creates an equivalent circuit having the same level of analysis accuracy as the conventional method, it is possible to reduce the numbers of elements and nodes that constitute the equivalent circuit to a great extent, compared with the conventional method. This makes it possible to significantly reduce the quantity consumed of memory against the conventional method, and to significantly shorten the analysis time, in the circuit analysis using the equivalent circuit. It is also possible to analyze the circuit response on a computer with the equivalent circuit according to the invention; and from the result of the analysis, it is also possible to analyze on the computer the current distribution in the system before being replaced by the equivalent circuit.

According to the invention, it is possible to calculate an equivalent circuit, in which the number of elements constituting the network is reduced to a great extent with a target accuracy secured.

According to the invention, it is possible to reproduce the current distribution and voltage distribution and so forth in the original complicated network, by using the analysis result of the equivalent circuit.

What is claimed is:

1. A method of calculating an equivalent circuit by a computer, with regard to an object that has a conductor, a dielectric to support the conductor, and plural input/output terminals to the outside, does not have sources and sinks of currents inside thereof, and satisfies the linearity and reciprocity to the input/output amounts of currents and voltages, and to the object such that the internal electric characteristics are invariable with time, the method comprising the steps of:

receiving inputs of geometry information to specify a shape of a conductor in a circuit board being the object of determining the equivalent circuit, and material information to specify a material of the circuit board;

partitioning, on the basis of the geometry information received, the shape of the objective conductor into meshes, and creating and storing mesh data to be expressed;

calculating a nodal admittance matrix from the mesh data, and storing the result;

calculating a number of nodes and a number of independent networks on the basis of the mesh data, and determining an incidence matrix to decide a connection of a tree structure that radially connects any of reference nodes to the other nodes;

determining a structure of an equivalent circuit network by means of the nodal admittance matrix and incidence matrix as calculated above; and determining values of elements of the equivalent circuit network.

2. A program that makes a computer calculate an equivalent circuit, with regard to an object that has a conductor, a dielectric to support the conductor, and plural input/output terminals to the outside, does not have sources and sinks of currents inside thereof, and satisfies the linearity and reciprocity to the input/output amounts of currents and voltages, and to the object such that the internal electric characteristics are invariable with time, the program comprising the steps of:

receiving inputs of geometry information to specify a shape of a conductor in a circuit board being the object of determining the equivalent circuit, and material information to specify a material of the circuit board;

partitioning, on the basis of the geometry information received, the shape of the objective conductor into meshes, and creating and storing mesh data to be expressed;

calculating a nodal admittance matrix from the mesh data, and storing the result;

calculating a number of nodes and a number of independent networks on the basis of the mesh data, and determining an incidence matrix to decide a connection of a tree structure that radially connects any of reference nodes to the other nodes;

determining a structure of an equivalent circuit network by means of the nodal admittance matrix and incidence matrix as calculated above; and determining values of elements of the equivalent circuit network.

3. A recording medium in which is recorded the program for calculating an equivalent circuit as claimed in claim 2.

4. A circuit analysis method comprising the steps of:

performing a method of calculating an equivalent circuit by a computer, with regard to an object that has a conductor, a dielectric to support the conductor, and plural input/output terminals to the outside, does not have sources and sinks of currents inside thereof, and satisfies the linearity and reciprocity to the input/output amounts of currents and voltages, and to the object such that the internal electric characteristics are invariable with time, the method of calculating an equivalent circuit comprising the steps of:

receiving inputs of geometry information to specify a shape of a conductor in a circuit board being the object of determining the equivalent circuit, and material information to specify a material of the circuit board;

partitioning, on the basis of the geometry information received, the shape of the objective conductor into meshes, and creating and storing mesh data to be expressed;

calculating a nodal admittance matrix from the mesh data, and storing the result;

calculating a number of nodes and a number of independent networks on the basis of the mesh data, and determining an incidence matrix to decide a connection of a tree structure that radially connects any of reference nodes to the other nodes;

determining a structure of an equivalent circuit network by means of the nodal admittance matrix and incidence matrix as calculated above; and determining values of elements of the equivalent circuit network, and extracting a voltage potential at the node where a connection is made to the outside of a system being the equivalent circuit, replacing the voltage potential onto the equivalent circuit as a voltage source, and executing a circuit analysis by using the obtained equivalent circuit.

5. A system of calculating an equivalent circuit, with regard to an object that has a conductor, a dielectric to support the conductor, and plural input/output terminals to the outside, does not have sources and sinks of currents inside thereof, and satisfies the linearity and reciprocity to the input/output amounts of currents and voltages, and to the object such that the internal electric characteristics are invariable with time, the system comprising:

a means that receives input of geometry information to specify a shape of a conductor in a circuit board being the object of determining the equivalent circuit, and material information to specify a material of the circuit board;

a means that partitions, on the basis of the geometry information received, the shape of the objective conductor into meshes, and creates and stores mesh data to be expressed;

a means that calculates a nodal admittance matrix from the mesh data, and storing the result;

a means that calculates a number of nodes and a number of independent networks on the basis of the mesh data, and determines an incidence matrix to decide a connection of a tree structure that radially connects any of reference nodes to the other nodes;

a means that determines a structure of an equivalent circuit network by means of the nodal admittance matrix and incidence matrix as calculated above; and a means that determines values of elements of the equivalent circuit network.

* * * * *